(12) United States Patent  (10) Patent No.: US 7,432,216 B2
Shimamoto et al.  (45) Date of Patent: Oct. 7, 2008

(54) SEMICONDUCTOR DEVICE AND MANUFACTURING METHOD THEREOF

(75) Inventors: Yasuhiro Shimamoto, Leuven (BE); Shinichi Saito, Kawasaki (JP); Shimpei Tsujikawa, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/503,935

(22) Filed: Aug. 15, 2006

(65) Prior Publication Data

US 2006/0273357 A1  Dec. 7, 2006

Related U.S. Application Data

(63) Continuation of application No. 10/788,278, filed on Mar. 1, 2004, now Pat. No. 7,112,833.

(30) Foreign Application Priority Data

Mar. 24, 2003  (JP)  ............ P2003-079375

(51) Int. Cl.
  *H01L 21/31* (2006.01)
  *H01L 21/8238* (2006.01)
  *H01L 21/336* (2006.01)
  *H01L 29/06* (2006.01)
(52) U.S. Cl. .......... 438/769; 438/216; 438/261; 257/411; 257/639; 257/649; 257/E21.2; 257/E21.267
(58) Field of Classification Search .......... 438/241, 438/258, 769, 954, 216, 261, 981; 257/288, 257/350, E29.013, E21.2, 411, 639, 649, 257/E21.267
See application file for complete search history.

(56) References Cited

U.S. PATENT DOCUMENTS 6,207,506 B1  3/2001  Yi et al.
6,459,126 B1  10/2002  Mogami et al.

(Continued)

FOREIGN PATENT DOCUMENTS

JP  11-135774  5/1999

(Continued)

OTHER PUBLICATIONS

E. Gusev et al., "Ultrathin High-K Gate Stacks for Advanced CMOS Devices", IEEE, IEDM 2001 Tech. Digest, 2001, 4pp.

(Continued)

*Primary Examiner*—Long K Tran
(74) *Attorney, Agent, or Firm*—Mattingly, Stanger, Malur & Brundidge, P.C.

(57) ABSTRACT

The technique capable of reducing the power consumption in the MISFET by suppressing the scattering of the carriers due to the fixed charges is provided. A silicon oxynitride film with a physical thickness of 1.5 nm or more and the relative dielectric constant of 4.1 or higher is formed at the interface between a semiconductor substrate and an alumina film. By so doing, a gate insulator composed of the silicon oxynitride film and the alumina film is constituted. The silicon oxynitride film is formed by performing a thermal treatment of a silicon oxide film formed on the semiconductor substrate in a NO or $N_2O$ atmosphere. In this manner, the fixed charges in the silicon oxynitride film are set to $5\times10^{12}$ $cm^{-2}$ or less, and the fixed charges in the interface between the silicon oxynitride film and the alumina film are set to $5\times10^{12}$ $cm^{-2}$ or more.

11 Claims, 15 Drawing Sheets

U.S. PATENT DOCUMENTS 6,885,105 B2      4/2005    Kakamu et al.
2002/0185693 A1    12/2002   Yasuda et al.

OTHER PUBLICATIONS

Z. Luo et al., "Ultrathin ZrO2 (or Silicate) with High Thermal Stability for CMOS Gate Applications", 2001 Symposium on VLSI Technology Digest of Technical Papers, 2001, 2 pp.

D. Buchanan et al., "80 nm Poly-silicon Gated n-FETs with Ultrathin Al2O3 Gate Dielectric for ULSI Applications", IEDM 200 Tech. Digest, 2000, 4 pp.

M. Hiratani et al., "Effective Electron Mobility Reduced by Remote Charge Scattering in High-k Gate Stacks", Jpn. J. Appl. Phys., vol. 41, 2002, pp. 4521-4522.

SEMICONDUCTOR DEVICE AND MANUFACTURING METHOD THEREOF

This application is a continuation of U.S. patent application Ser. No. 10/788,278, filed Mar. 1, 2004, now U.S. Pat. No. 7,112,833 which is incorporated by reference herein in its entirety.

BACKGROUND OF THE INVENTION

The present invention relates to a semiconductor device and a technique for manufacturing the semiconductor device and, particularly, to a technique effectively applied to a field effect transistor (hereinafter "MISFET (Metal Insulator Field Effect Transistor)") in which the electrical thickness of a gate insulator in terms of $SiO_2$ (hereinafter "equivalent $SiO_2$ thickness (EOT)") is 2.5 nm or less.

The miniaturization of the MISFET that is the basic element of a large scale integrated circuit (LSI) has been achieved based on a scaling rule. However, it is thought that a current gate insulator made of silicon oxide ($SiO_2$) cannot be used if the physical thickness (hereinafter referred to as "thickness") of the gate insulator is reduced to 2.0 nm or less due to the increased power consumption and the reduced reliability caused by the increase of a direct tunnel leakage current. Also, since the thin silicon oxide film as mentioned above cannot properly function as a diffusion barrier layer in impurities, the impurity leakage from the gate electrode to the substrate occurs. Furthermore, strict manufacture control is required for uniform mass productions of thin silicon oxide films each having a thickness of 2.0 nm or less.

Therefore, in order to break through the limitation of the scaling rule and achieve the further miniaturization and high-speed operation of the MISFET, development of dielectric materials capable of obtaining the field effect identical to or higher than that of the silicon oxide film has been progressed rapidly even if the thickness of the dielectric material is larger than that of the silicon oxide film. As examples of such materials, there are: the group IV oxides such as zirconia ($ZrO_2$) and hafnia ($HfO_2$); the group III oxides such as alumina ($Al_2O_3$); silicate that is solid solution of the metal oxides as mentioned above and silicon oxide; and the like.

The above-mentioned group IV and III oxides are the materials used as gate insulators at the early stage of the development of silicon semiconductor. However, after the establishment of technologies for forming the gate insulator made of silicon oxide, silicon oxide has been mainly used because of its excellent properties.

Note that the MISFET using zirconia as the gate insulator (e.g., IEDM' 2001 Tech. Digest p. 451, 2001), the MISFET using hafnia as the gate insulator (e.g., 2001 Symposium on VLSI Technology Digest of Technical Papers, p. 135), the MISFET using alumina as the gate insulator (e.g., IEDM' 2000 Tech. Digest p. 223, 2000), and the method of producing metal silicate (e.g., Japanese Patent Laid-Open No. 11-135774) has been reported so far.

Additionally, in an n type MISFET having a laminated gate insulator formed by sequentially depositing a silicon oxide film and a dielectric film in this order from below on a substrate made of single crystal silicon, an electron mobility is increased along with the increase in the thickness of the silicon oxide film due to the Coulomb scattering by a fixed charge of $10^{13}$ $cm^{-2}$ or more existing at an interface between the silicon oxide film and the dielectric film (Jpn. J. Appl. Phys. Vol. 41 (2002) p. 4521).

SUMMARY OF THE INVENTION

Meanwhile, when compared by the same equivalent $SiO_2$ thickness in consideration of relative dielectric constant, the leakage current of the gate insulator formed of a metal oxide film can be reduced in comparison to that of the conventional gate insulator formed of a silicon oxide film or a silicon oxynitride (SiON) film. However, it has been apparent by the inventors that carriers are scattered due to the fixed charges resulting from the metal oxide film, and as a result, the driving current of the MISFET is reduced, and therefore when compared by the same driving current, the leakage current of the gate insulator formed of a metal oxide film is larger than that of the conventional gate insulator formed of a silicon oxide film or a silicon oxynitride film. Also, the threshold value of the MISFET is greatly varied due to the distribution of the impurities from polycrystalline silicon that forms the gate electrode.

An object of the present invention is to provide a technique capable of reducing the power consumption of the MISFET by suppressing the carrier scattering due to the fixed charges.

The typical ones of the inventions disclosed in this application will be briefly described as follows.

The present invention is a semiconductor device comprising:

a field effect transistor including a gate insulator formed on a substrate, the gate insulator having an equivalent $SiO_2$ thickness of 2.5 nm or less, and a gate electrode formed on the gate insulator, wherein the gate insulator is a laminated film composed of a silicon oxynitride film coming into contact with the substrate and a metal oxide film with a relative dielectric constant higher than that of the silicon oxynitride film, the physical thickness of the silicon oxynitride film is 1.5 nm or more, and the relative dielectric constant of the silicon oxynitride film is 4.1 or higher.

The present invention is a semiconductor device comprising:

a field effect transistor including a gate insulator formed on a substrate, the gate insulator being formed of a silicon oxynitride film with an equivalent $SiO_2$ thickness of 2.5 nm or less, and a gate electrode formed on the gate insulator, wherein the silicon oxynitride film is composed of a first silicon oxynitride film formed by oxynitriding a silicon nitride film formed on the substrate, and a second silicon oxynitride film formed by oxynitriding the substrate disposed below the silicon nitride film.

The present invention is a manufacturing method of a semiconductor device, comprising the step of:

forming a field effect transistor including a gate insulator formed on a substrate, the gate insulator having an equivalent $SiO_2$ thickness of 2.5 nm or less, and a gate electrode formed on the gate insulator, wherein the gate insulator is a laminated film composed of a silicon oxynitride film coming into contact with the substrate and a metal oxide film with a relative dielectric constant higher than that of the silicon oxynitride film, the physical thickness of the silicon oxynitride film is 1.5 nm or more, and the relative dielectric constant of the silicon oxynitride film is 4.1 or higher, wherein the silicon oxynitride film is formed by performing a thermal treatment of the substrate, a silicon oxide film formed on the substrate, or a silicon nitride film formed on the substrate in a NO or $N_2O$ atmosphere.

The present invention is a manufacturing method of a semiconductor device, in which a field effect transistor, including a gate insulator formed on a substrate, the gate insulator being formed of a silicon oxynitride film with an equivalent $SiO_2$ thickness of 2.5 nm or less and a gate electrode formed on the gate insulator, is formed, the method comprising the steps of:

forming, on the substrate, a silicon nitride film with a physical thickness of 0.9 nm; and forming the silicon oxynitride film by performing a thermal treatment of the silicon nitride film in a NO or $N_2O$ atmosphere, wherein the physical thickness of the silicon oxynitride film is increased 1.9 times or more of the silicon nitride film.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbol throughout the drawings for describing the embodiments and the repetitive description thereof will be omitted. Additionally, needless to say, the material, conductive type, and the manufacturing conditions, etc. of each component part are not limited to those described in the embodiments, and various modifications are possible. Note that the equivalent $SiO_2$ thickness of a gate insulator formed of a metal oxide film used in the following description is calculated by using the method shown in p. 348 of IEEE Electron Device Letters, Volume 23 (2002) by S. Saito et al.

First Embodiment

Figure 1:
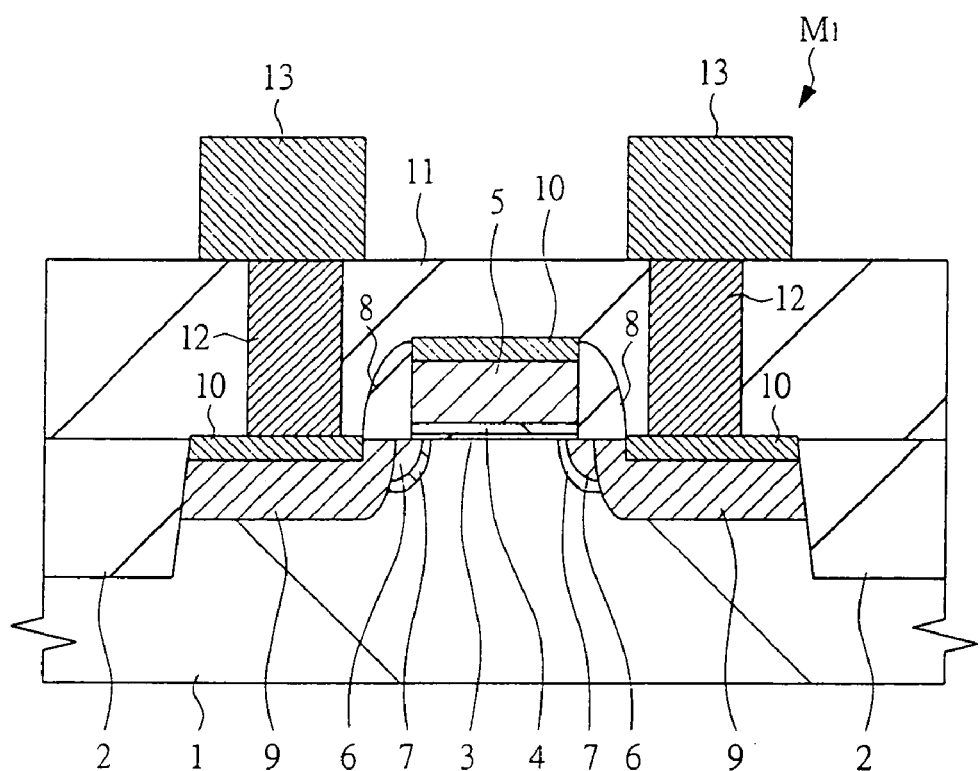
FIG. 1 is a sectional view of the principal portion of a semiconductor substrate showing the n type MISFET according to a first embodiment of the present invention.
Figure 2:
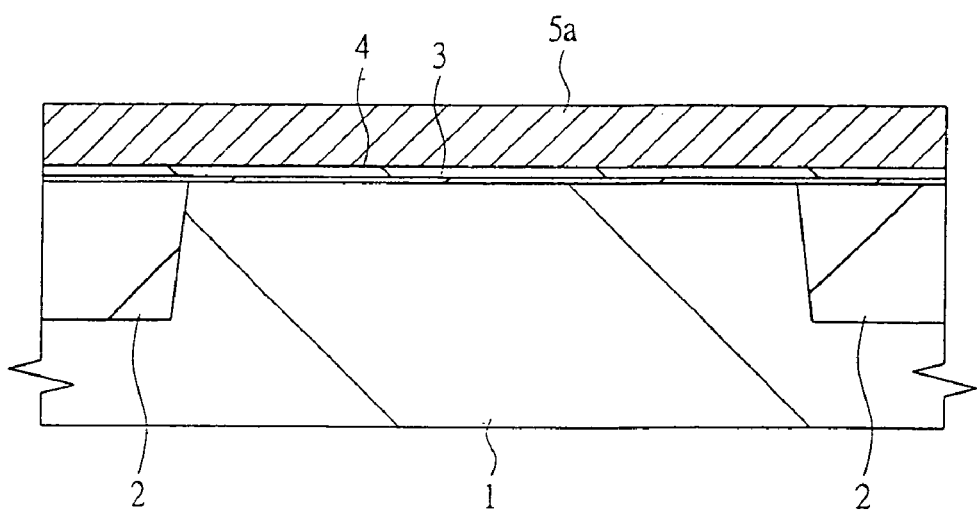
FIG. 2 is a sectional view of the principal portion of a semiconductor substrate, which shows a manufacturing method for the n type MISFET according to a first embodiment of the present invention.
Figure 3:
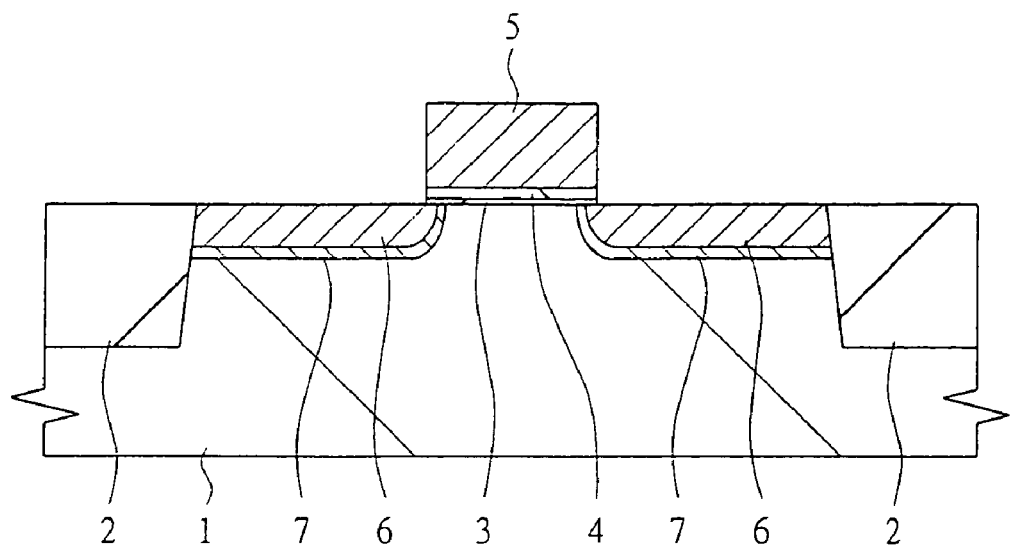
FIG. 3 is a sectional view of the principal portion of a semiconductor substrate, which shows a manufacturing method for the n type MISFET according to a first embodiment of the present invention.
Figure 4:
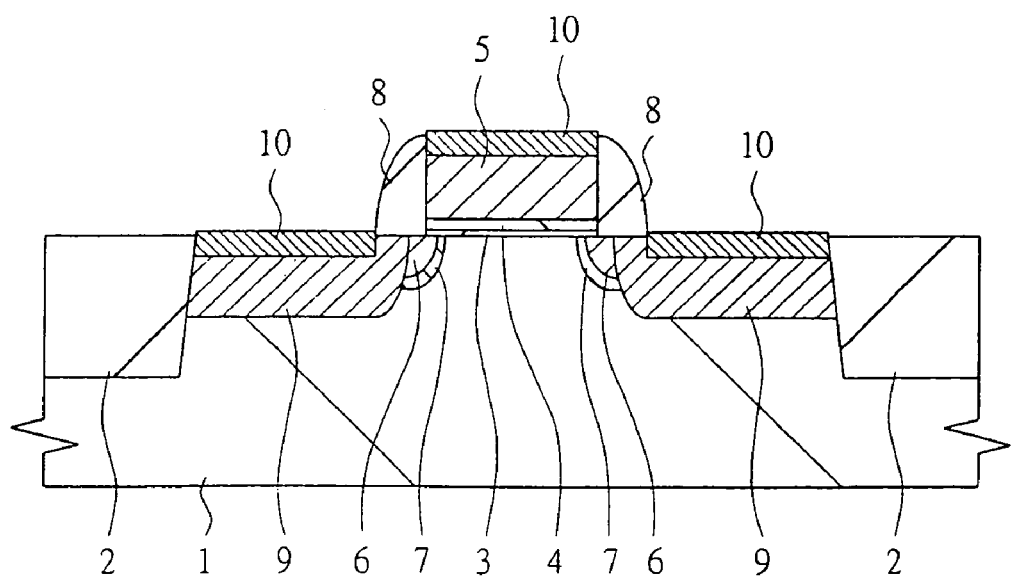
FIG. 4 is a sectional view of the principal portion of a semiconductor substrate, which shows a manufacturing method for the n type MISFET according to a first embodiment of the present invention.

FIG. 1 is a sectional view of the principal portion of a semiconductor substrate showing the n type MISFET according to a first embodiment of the present invention, and FIGS. 2 to 4 are schematic views showing the manufacturing method for the n type MISFET.

An n type MISFET $M_1$ according to the first embodiment has a gate insulator with a thickness of 2.5 nm or less, and the gate insulator is composed of a laminated film of a silicon oxynitride film 3 and an alumina film 4 deposited in this order from below as shown in FIG. 1. For example, the n type MISFET $M_1$ can be formed in the following manner.

First, as shown in FIG. 2, device isolation insulating regions 2 for defining active regions are formed in a semiconductor substrate 1 made of single crystal silicon with plane direction (100), a p conductivity type, and a diameter of 20 cm. Subsequently, an implantation of p conductivity type ions for adjusting a substrate concentration and a thermal treatment for enlargement, as well as an ion implantation for adjusting the threshold voltage and a thermal treatment for activation are respectively performed by the conventional and well-known manner.

Next, after the removal of a natural oxide film on the surface of the semiconductor substrate 1 by the cleaning of diluted hydrofluoric acid, the substrate 1 is oxidized by the well-known method to grow a silicon oxide film with a thickness of 1.3 nm. Next, the silicon oxide film is oxynitrided by the thermal treatment in an NO or $N_2O$ atmosphere to form a silicon oxynitride film 3 with a thickness of 1.5 nm or more. At this time, nitrogen is introduced into the interface between the semiconductor substrate 1 and the silicon oxynitride film 3. Note that the temperature of the thermal treatment in the NO or $N_2O$ atmosphere is desirably set to approximately 800 to 1100° C. Additionally, the initial thickness of the silicon oxide film is controlled so that the thickness of the silicon oxynitride film 3 can be 1.5 nm or more. For example, in the case where the initial thickness of the silicon oxide film is 0.5, 0.9, 1.3, or 1.8 nm, the silicon oxynitride film 3 with a thickness of 0.8, 1.2, 1.5, or 2.0 nm is formed respectively by performing the high-speed thermal treatment at 1000° C. for 30 seconds in the NO atmosphere. The relative dielectric constant of the silicon oxynitride film 3 formed in the above-described manner is in a range of 4.1 to 5.0.

Next, an alumina film 4 is formed on the silicon oxynitride film 3 by an atomic layer deposition method. For example, alumina can be formed at 300° C. by alternately supplying trimethyl aluminum and $H_2O$ that are the materials thereof. When one supply of each gas is defined as one cycle, the alumina film 4 with a thickness of 1.0 to 3.0 nm is deposited by performing 15 to 40 cycles. Subsequently, the thermal treatment at 700° C. or higher in an $N_2$ or reduced pressure oxygen-atmosphere is performed to densify the alumina film 4 or to compensate the vacancy of oxygen in the alumina film 4.

Next, an in-situ phosphorus doped polycrystalline silicon film 5a with a thickness of approximately 100 nm to be a gate insulator is formed on the alumina film 4. This in-situ phosphorus doped polycrystalline silicon film 5a can be deposited, for example, at 630° C. with using monosilane and hosfine as material gases. Note that even if the impurities are not added in advance unlike the above-mentioned in-situ phosphorus doped polycrystalline silicon film 5a, the resistance thereof can be reduced without any difficulty by the selective ion-implantation of high-concentration phosphorus into a desired gate electrode region.

Next, as shown in FIG. 3, after the thermal treatment is performed in the $N_2$ atmosphere at 950° C. for 5 minutes, the in-situ phosphorus doped polycrystalline silicon film 5a is processed to a gate electrode 5. Thereafter, arsenic ions are vertically implanted under the conditions of the acceleration energy of 3 keV and the dose amount of $1\times10^{15/cm2}$ and thereby shallow diffusion layers 6 are formed. Subsequently, boron ions are vertically implanted under the conditions of the acceleration energy of 10 keV and the dose amount of $4\times10^{13}/cm^2$ so as to surround the shallow diffusion layers 6. By so doing, p type punch-through preventing layers 7 are formed for preventing the punch through.

Next, as shown in FIG. 4, after a silicon oxide film with a thickness of approximately 50 nm is deposited on the whole surface of the semiconductor substrate 1 at a low temperature of 400° C. by a plasma-assisted deposition method, the silicon oxide film is selectively left by anisotropic dry etching to form gate sidewall insulators 8 only on sidewalls of the gate electrode 5. Subsequently, arsenic ions are vertically implanted under the conditions of the acceleration energy of 30 keV and the dose amount of $2\times10^{15}/cm^2$ with using the gate sidewall insulators 8 as ion implantation blocking masks, and thereby an n type high-density diffusion layer 9 is formed. Then, the implanted ions are activated by performing the thermal treatment in the nitrogen atmosphere at 1000° C. for 5 seconds.

Next, a relatively thin cobalt film is deposited on the whole surface of the semiconductor substrate 1 by a sputtering method, and is silicided by a short-time thermal treatment at 500° C. The unreacted cobalt film is removed by a mixed solution of hydrochloric acid and hydrogen peroxide solution, and a cobalt silicide film 10 is selectively left on each of the exposed portions of the semiconductor substrate 1 and on the gate electrode 5. Thereafter, the resistance of the cobalt silicide film 10 is reduced by the short-time thermal treatment.

Next, after forming a relatively thick silicon oxide film on the whole surface of the semiconductor substrate 1, the surface of the silicon oxide film is planarized by chemical mechanical polishing to form a surface protection insulator 11. Subsequently, after forming holes in a desired region of the surface protection insulator 11, a TiN film as a diffusion barrier of a wiring metal and a dielectric metal film as a wiring metal, for example, a tungsten film are sequentially deposited, and then the TiN film and the tungsten film are selectively left only inside the holes by a planarization polishing to form plugs 12. Thereafter, a metal film mainly made of aluminum is deposited and patterned in accordance with a desired circuit configuration and, thereby, wirings including source and drain electrodes 13 are formed. In this manner, the n type MISFET $M_1$ shown in FIG. 1 is almost completed.

Figure 5:
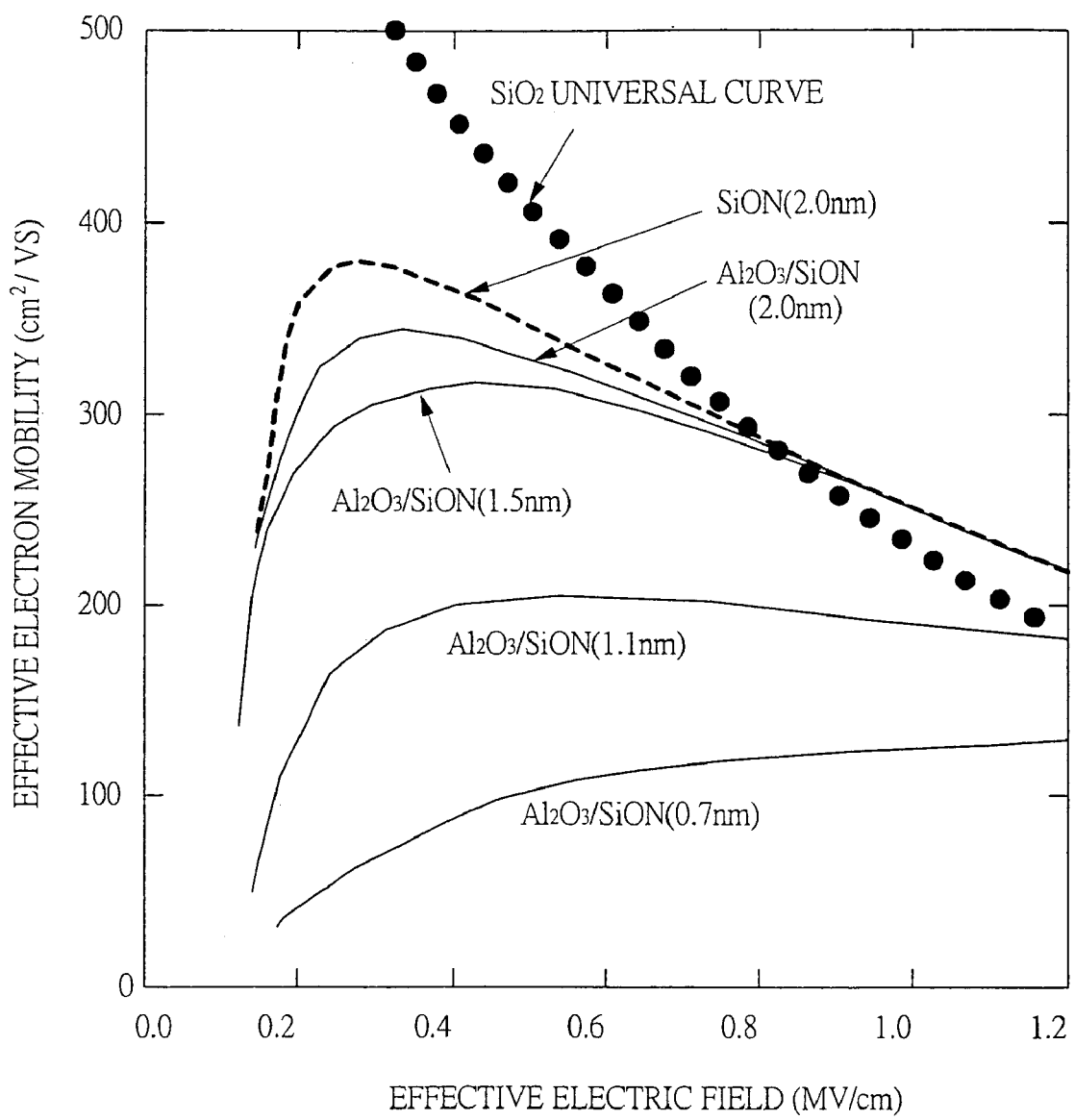
FIG. 5 is a graph showing the relationship between the effective electron mobility and the effective electric field of the n type MISFET in which the physical thickness of a silicon oxynitride film is used as a parameter.

The relationship between the effective electron mobility and the effective electric field of the n type MISFET which uses a laminated film of a silicon oxynitride film and an alumina film as a gate insulator is shown in FIG. 5 by using the thickness of the silicon oxynitride film as a parameter. The thickness of the alumina film is set to 2.0 nm, and a universal curve of the silicon oxide film and the mobility of the 2.0 nm thick silicon oxynitride film are shown in FIG. 5.

The mobility in the case of using the laminated film of a silicon oxynitride film and an alumina film is remarkably increased along with the increase in the thickness of the silicon oxynitride film, and it gradually comes close to the mobility of the 2.0 nm thick silicon oxynitride film. Also, it can be understood that when the thickness of the silicon oxynitride film is 1.5 nm or more, the decrease in the mobility is reduced. In comparison to the mobility of the 2.0 nm thick silicon oxide film, that of the 2.0 nm thick silicon oxynitride film is reduced on a low electric field side and increased on a high electric field side. As reported in p. 381 of Extended Abstract of SSDM 2001 by T. Ishihara et. al, this is because the scattering due to the surface roughness is varied when nitrogen exists at the interface between the semiconductor substrate (hereinafter referred to as "Si substrate") made of single crystal silicon and the silicon oxynitride film. Also in the case where a laminated film of a silicon oxynitride film and an alumina film is used, the same mobility features as those in the case where only the silicon oxynitride film is used are observed. Therefore, it can be understood that the mobility is determined depending on the underlying silicon oxynitride film.

In the foregoing, the case where an alumina film formed by the atomic layer deposition is used as an example of the metal oxide film has been described. However, it is also possible to deposit a hafnia film or a zirconia film by selecting $HfCl_4$ or $ZrCl_4$ as a material gas. Since these films have high relative dielectric constant, a hafnia film or a zirconia film with a thickness of 1.0 to 7.0 nm can be deposited by performing 20 to 160 cycles.

Also, as the deposition method of the metal oxide film, organic metal chemical vapor deposition or a sputtering method is also available. In the organic metal chemical vapor deposition, a hafnia film can be deposited by using Hf-t-butoxide as a material, and a zirconia film can be deposited by using Zr-t-butoxide as a material. By the sputtering method employing an Ar gas in which Al, Hf, and Zr, etc. are used as target metals, it is also possible to deposit the metals of Al, Hf, and Zr on a silicon oxynitride film and then oxidize them to form the alumina film, the hafnia film, and the zirconia film. Additionally, it is also possible to form metal oxide by a reactive sputtering method performed while oxygen is supplied thereto. Also, when hafnia and zirconia are selected as the metal oxide, mutual diffusion proceeds (a silicate layer is formed) between the silicon oxynitride film and the metal oxide film by the thermal treatment performed during the deposition or after the formation of these films and thereby the boundary between the silicon oxynitride film and the metal oxide film becomes unclear in comparison to the case of using alumina. In the case of using these films, it is necessary to control the thickness of the silicon oxynitride film so that the area density of Hf, Zr, and Al can be $5 \times 10^{13}$ $atom/cm^2$ or less within a region of 1.5 nm or less from a Si substrate.

Figure 6:
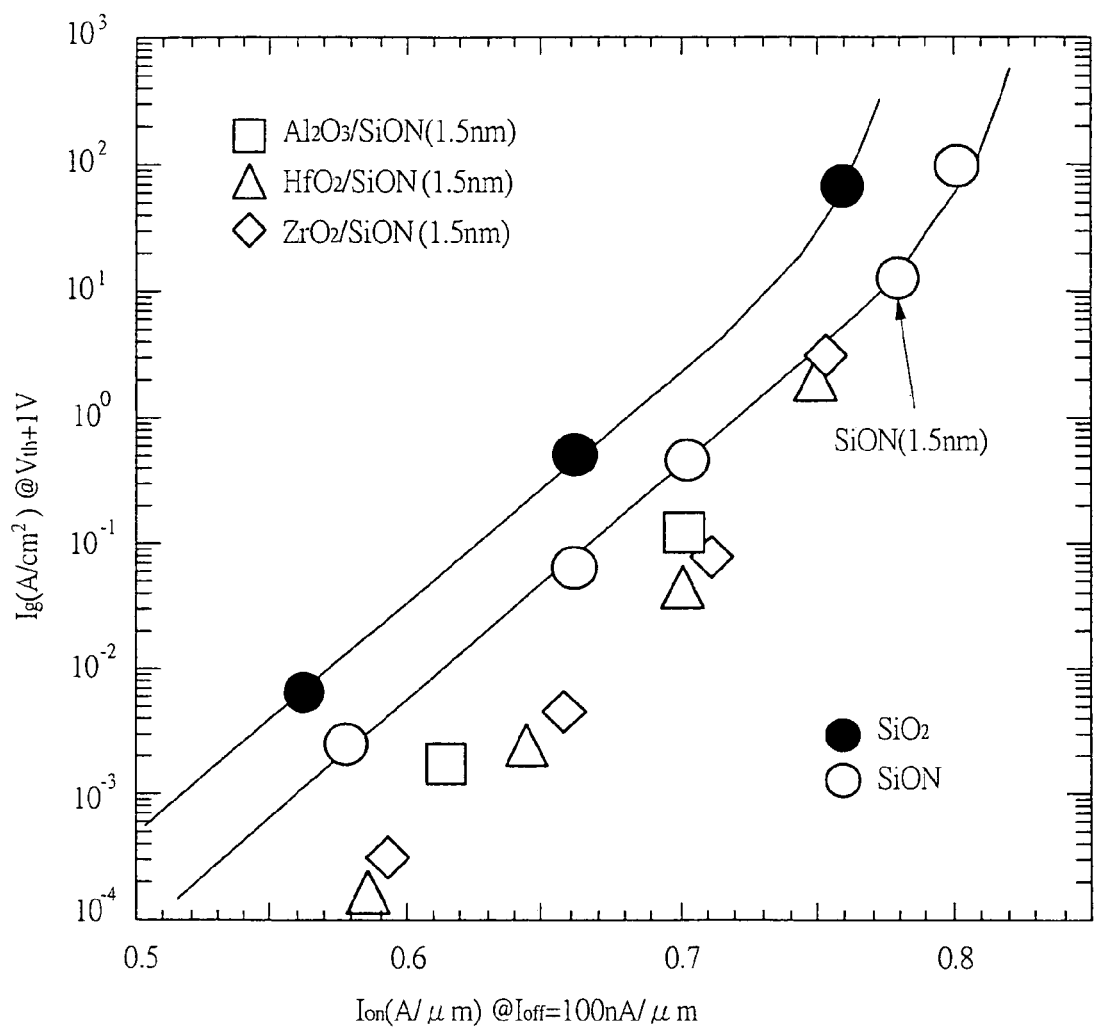
FIG. 6 is a graph showing the relationship between the driving current (Ion) and the leakage current (Ig) of an n type MISFET.

The relationship between a driving current (Ion) and a leakage current (Ig) of the n type MISFET using, as a gate insulator, the laminated film of a silicon oxynitride film and a metal oxide film is shown in FIG. 6. FIG. 6 shows the results in the case where: the 1.5 nm thick silicon oxynitride film formed in the above-mentioned manner is used as a silicon oxynitride film; and the alumina film with a thickness of 1.0 to 2.0 nm, the hafnia film with a thickness of 1.0 to 5.0 nm, and the zirconia film with a thickness of 1.0 nm to 5.0 nm are used as metal oxide films. The leakage current is defined as one obtained at the time when the gate voltage (Vg) and the threshold voltage (Vth) comply with the formula "Vg=Vth+1.0 V". Also, the driving current is defined as that in such gate length that the off current (Ioff) is given a value of 100 nA/μm at the gate voltage Vg=0V and |Vd|=1V when each absolute value of the gate voltage and the drain voltage (Vd) is 1.0 V. Additionally, the results in the case of using only the silicon oxynitride film having different thickness and those in the case of using only the silicon oxide film are also shown in FIG. 6.

As shown in FIG. 6, the laminated film of a silicon oxynitride film and a metal oxide film has such a region that it is larger in a driving current and smaller in a leakage current than only the silicon oxynitride film. Furthermore, the effect of the leakage current reduction is increased as the thickness of the metal oxide film becomes larger. Additionally, as seen from the drawing, in the region where the driving current is 0.7 A/μm, it is possible to form the laminated film of a silicon oxynitride film and a metal oxide film, the laminated film having a leakage current one-hundredth as much as or less than that of only the silicon oxide film. The results described above show that the decrease in the mobility can be reduced because the fixed charges at the interface between the silicon oxynitride film and the metal oxide film can be placed at a position apart from a channel. As a result of having analyzed the fixed charges in the film based on the mobility and a flat band shift by using the method as shown in p. 4521 of Jpn. J. Appl. Phys. Vol 41 (2002), it is found out that the fixed charges in the silicon oxynitride film is $5 \times 10^{12}$ $cm^{-2}$ or less and a fixed charge of $5 \times 10^{12}$ $cm^{-2}$ or more exists in the interface between the silicon oxynitride film and the metal oxide film or in the metal oxide film.

Figure 7:
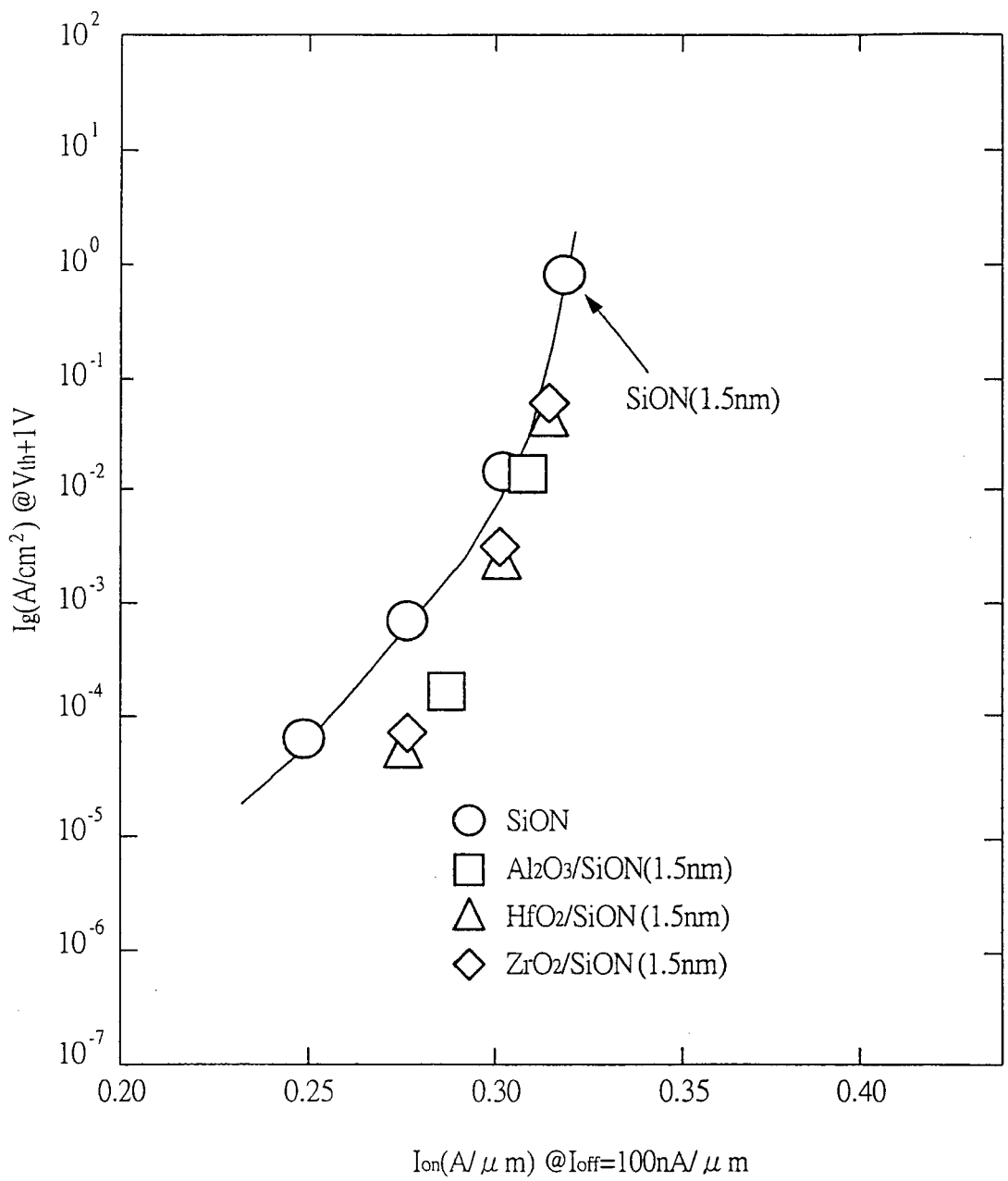
FIG. 7 is a graph showing the relationship between the driving current (Ion) and the leakage current (Ig) of a p type MISFET.

Similarly, the relationship between a driving current (Ion) and a leakage current (Ig) of the p type MISFET is shown in FIG. 7. In the process of forming the p type MISFET, a p type MISFET region is ensured before forming the gate insulator by using the well-known method, and polycrystalline silicon in which a p type impurity such as boron is introduced by the well-known techniques is used to form the gate electrode. Note that when the silicon oxide film is used as the gate insulator, boron having a thickness of 2.5 nm or less and contained in the gate electrode is diffused to the Si substrate and the threshold voltage is greatly changed, and so the relationship between the driving current and the leakage current of the p type MISFET using the silicon oxide film as the gate insulator is not shown in FIG. 7. Also in the case where a metal oxide film is laminated on the silicon oxide film, boron in polycrystalline silicon film forming the gate electrode by an activation thermal treatment at 900° C. or higher is diffused to the Si substrate and thereby the leakage current is increased. Meanwhile, in the case of using the silicon oxynitride film as the gate insulator, the operational p type MISFET can be obtained, by controlling a nitrogen concentration so that the relative dielectric constant can be 4.1 or higher. However, since the boron in the polycrystalline silicon film constituting the gate electrode is diffused to the Si substrate as the thickness of the silicon oxynitride film becomes smaller, the mobility is decreased. Therefore, the driving current is saturated with 0.32 A/μm.

However, as shown in FIG. 7, similarly to the case of the n type MISFET, the leakage current of the laminated film of the silicon oxynitride film and the metal film each having a thickness of 1.5 nm is smaller than that of only the silicon oxynitride film. This is because the diffusion of boron can be suppressed to some extent by the silicon oxynitride film constituting the laminated film.

Besides alumina, hafnia, and zirconia, $ZrSiO_4$, $HfSiO_4$, $Y_2O_3$, $La_2O_3$, $CeO_2$ or a laminated film of these metal oxides can also be used to suppress the leakage current and ensure the driving current in the n and p type MISFETs in comparison to the silicon oxynitride film. Further, besides the method of oxynitriding a silicon oxide film by the thermal treatment in the NO or $N_2O$ atmosphere, a method of performing the thermal treatment of the Si substrate directly in the NO or $N_2O$ atmosphere can also be used as the method of forming the silicon oxynitride film. Furthermore, the method of oxynitriding the silicon nitride film by the thermal treatment in the NO or $N_2O$ atmosphere can be also applied as the method of forming the silicon oxynitride film. This forming method will be described in detail in a second embodiment. Besides the polycrystalline silicon, refractory metal nitrides, for example, TaN, TiN, WN, MoN, ZrN, and HfN etc. can also be used as the gate electrode. This forming method will be described in detail in a fourth embodiment.

As described above, according to the first embodiment, the gate insulator of the MISFET is constituted by the laminated film in which the silicon oxynitride film 3 and the alumina film 4 each having a thickness of 1.5 nm or more and a relative dielectric constant of 4.1 or higher are deposited in this order from below. Therefore, it is possible to reduce the leakage current of the gate insulator and ensure the driving current thereof.

Second Embodiment

Figure 8:
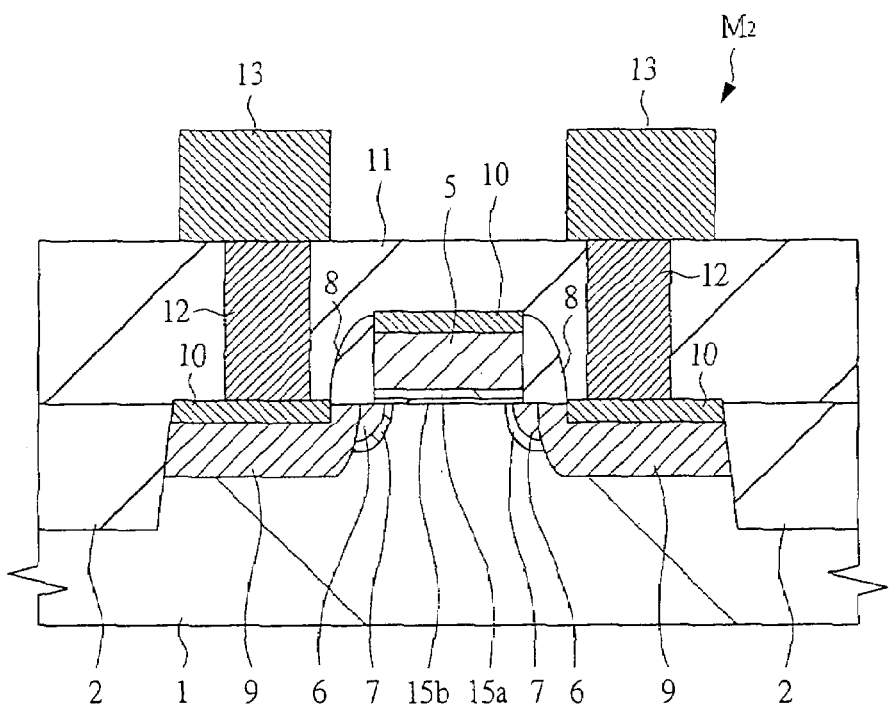
FIG. 8 is a sectional view of the principal portion of a semiconductor substrate showing the n type MISFET according to a second embodiment of the present invention.
Figure 9:
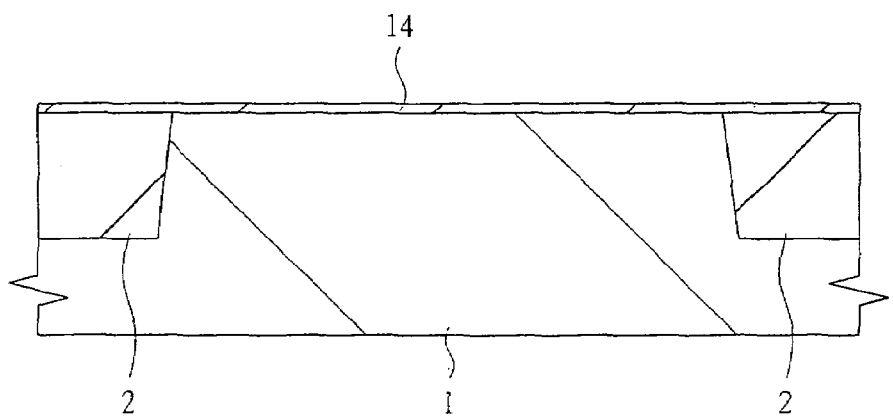
FIG. 9 is a sectional view of the principal portion of a semiconductor substrate, which shows a manufacturing method of the n type MISFET according to a second embodiment of the present invention.
Figure 10:
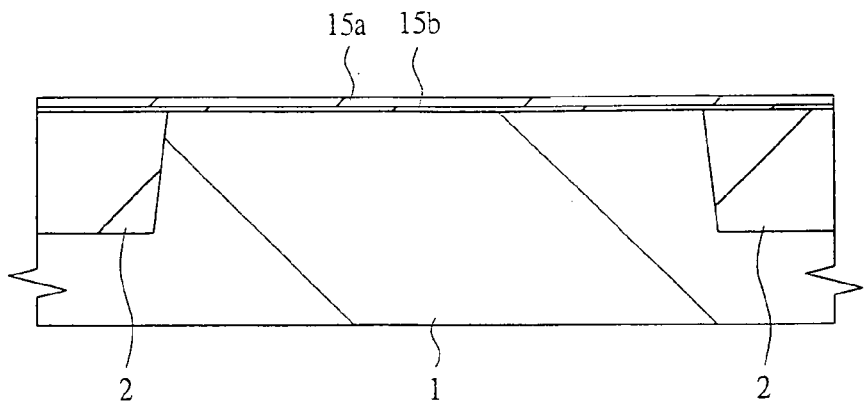
FIG. 10 is a sectional view of the principal portion of a semiconductor substrate, which shows a manufacturing method of the n type MISFET according to a second embodiment of the present invention.

FIG. 8 is a sectional view of the principal portion of the semiconductor substrate showing the n type MISFET according to a second embodiment of the present invention, and FIGS. 9 to 10 are schematic views showing a manufacturing process of the n type MISFET.

An n type MISFET $M_2$ according to the second embodiment has a gate insulator composed of first and second silicon oxynitride films $15a$ and $15b$, and its desired performance can be realized by controlling nitrogen profiles in the first and second oxynitride films $15a$ and $15b$ without depositing any metal oxide film. For example, the n type MISFET $M_2$ can be formed in the following manner.

First, as shown in FIG. 9, device isolation insulating regions 2 for defining active regions are formed in a semiconductor substrate 1 made of single crystal silicon with plane direction (100), a p conductivity type, and a diameter of 20 cm. Subsequently, an implantation of p conductivity type ions for adjusting a substrate concentration and a thermal treatment for enlargement, as well as an ion implantation for adjusting the threshold voltage and a thermal treatment for activation are respectively performed by the conventional and well-known manner.

Next, after the removal of a natural oxide film on the surface of the semiconductor substrate 1 by the cleaning using diluted hydrofluoric acid, the thermal treatment in the $NH_3$ atmosphere at 700° C. for 1 minute is performed to form a silicon nitride ($Si_3N_4$) film 14 with a thickness of 0.9 or less, for example, 0.7 nm on the semiconductor substrate 1. Furthermore, the thermal treatment in the $N_2O$ atmosphere at 900° C. for 1 minute is performed to form a silicon oxynitride film with a thickness of 1.7 nm. As shown in FIG. 10, this silicon oxynitride film is composed of a first silicon oxynitride film $15a$ formed by oxynitriding the silicon nitride film 14 and a second silicon oxynitride film $15b$ formed by oxynitriding the semiconductor substrate 1 located below the silicon nitride film 14.

Next, an in-situ phosphorus doped polycrystalline silicon film $5a$ to be a gate electrode with a thickness of approximately 100 nm is formed on the first silicon oxynitride film $15a$. This in-situ phosphorus doped polycrystalline silicon film $5a$ can be deposited at 630° C. using monosilane and phosphine as material gases. After this deposition, the n type MISFET $M_2$ shown in FIG. 8 is almost completed using the same manufacturing method as that shown in the first embodiment.

Figure 11:
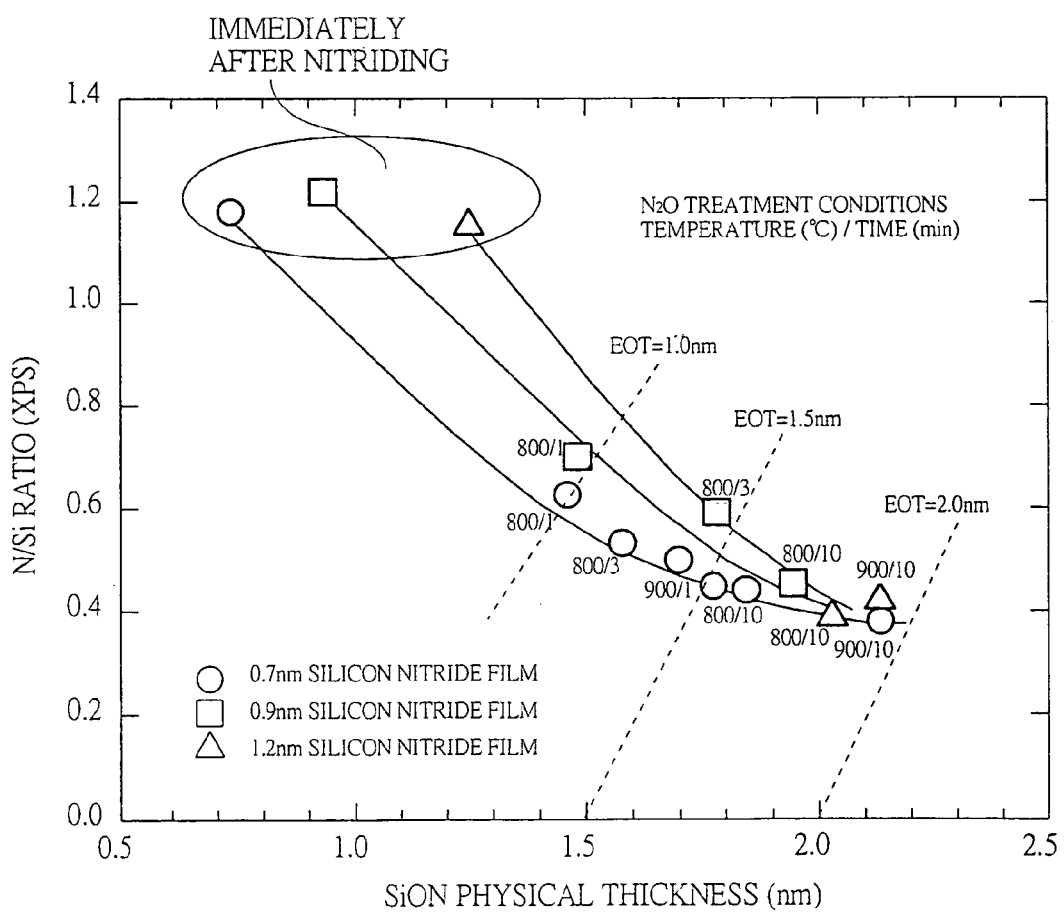
FIG. 11 is a graph showing the relationship between the physical thickness of the silicon oxynitride film formed in performing a thermal treatment of a silicon nitride film in an $N_2O$ atmosphere and the nitrogen concentration in the film.

The relationship between the thickness of the silicon oxynitride film and the nitrogen concentration in the silicon oxynitride film is shown in FIG. 11, in which the temperature and time of the thermal treatment in the $N_2O$ atmosphere are used as parameters. The thickness and the nitrogen concentration of the silicon oxynitride film can be obtained by an X-ray photoelectron spectroscopy (XPS) method using the $MgK\alpha_{1,2}$ radiation (1253.6 eV). The thickness $d_{SiON}$ of the silicon oxynitride film is obtained by using the formula (1). In this case, the strength of the peak of $Si^0$ bonding and the strength of peak of $Si^{4+}$ bonding of the Si substrate in an Si2p spectrum are $I(Si^0)$ and $I(Si^{4+})$, respectively. The term "θ" represents an angle between a specimen surface and a photoelectron detector, and it is set at 29° in this example.

$$d_{SiON}[nm] = 3.0 \sin\theta \ln\left(1 + \frac{1}{1.3}\frac{I(Si^{4+})}{I(Si^0)}\right) \quad (1)$$

Also, the nitrogen concentration (N/Si ratio) in the silicon oxynitride film is defined by using the formula (2). In this case, the strength of the peak of N1s bonding is I(N1s) and the sensitivity coefficients with respect to N and Si are $\alpha_N$ and $\alpha_{Si}$, respectively.

$$N/Si = \frac{\frac{I(N1s)}{\alpha_N}}{\frac{I(Si^{4+})}{\alpha_{Si}}}, \alpha_N = 0.42, \alpha_{Si} = 0.27 \quad (2)$$

FIG. 11 shows the changes in the cases where the thickness of the silicon nitride film immediately after the nitriding is set to 0.7, 0.9, and 1.2 nm, respectively. The N/Si ratio immediately after the nitriding is 1.2 in each case. It can be understood that when the thermal treatment of each silicon nitride film is performed in the $N_2O$ atmosphere, the N/Si ratio, that is, the nitrogen concentration in the silicon oxynitride film is reduced and the thickness of the silicon oxynitride film is increased accordingly. Also, it can be understood that, when compared by the silicon oxynitride films with the same thickness, the film in which the thickness immediately after the nitriding is larger has the larger N/Si ratio.

Additionally, FIG. 11 also shows the relationship between the thickness giving the equivalent $SiO_2$ thickness of 1.0, 1.5, or 2.0 nm and the N/Si ratio with respect to the silicon oxynitride film, the equivalent $SiO_2$ thickness being obtained by the capacitance measurement after forming the gate electrode formed of a polycrystalline silicon film. Since the relative dielectric constant of the film becomes higher than that of the silicon oxide film as the film has a larger N/Si ratio, it is possible to give the same equivalent $SiO_2$ thickness even when the thickness of the film is increased.

Figure 12A:
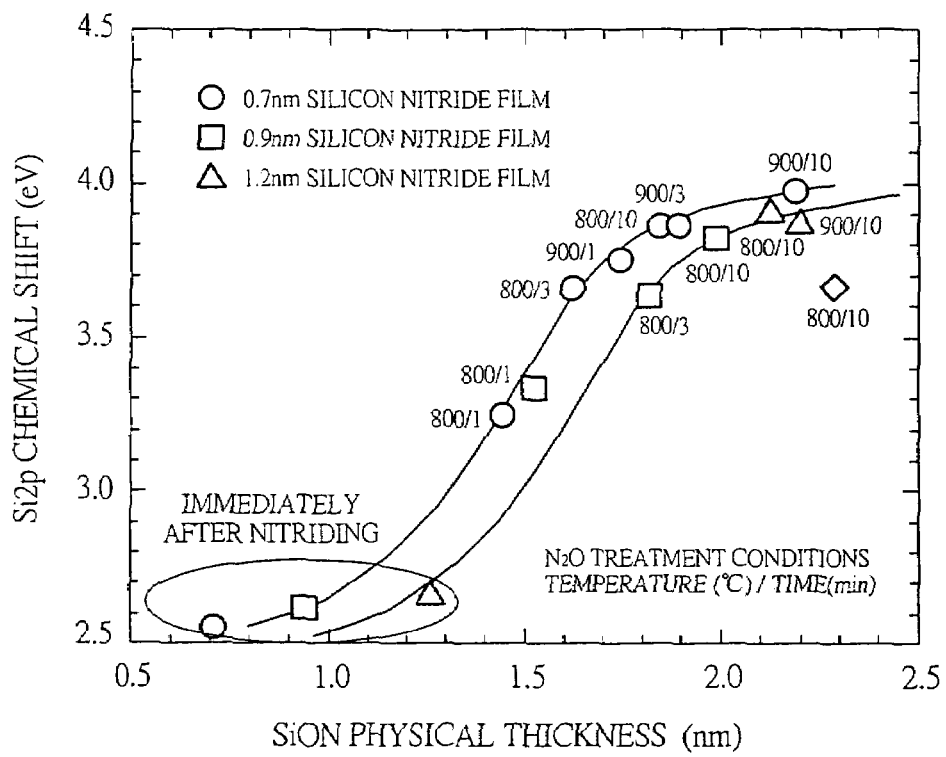
FIG. 12A is a graph showing the relationship between the physical thickness of a silicon oxynitride film formed in performing a thermal treatment of a silicon nitride film in an $N_2O$ atmosphere and the chemical shift of a Si2p spectrum.

The relationship between the thickness of the silicon oxynitride film and the chemical shift of the Si2p spectrum (difference between $Si^0$ peak energy of the Si substrate and $Si^{4+}$ peak energy of the silicon oxynitride film) is shown in FIG. 12A, in which temperature and time of the thermal treatment in the $N_2O$ atmosphere are used as parameters. The chemical shift immediately after the nitriding is approximately 2.5 eV and its value coincides with the bonding energy of the silicon in the silicon nitride film. Further, when the thermal treatment is performed in the $N_2O$ atmosphere, the chemical shift is increased along with the increase of the thickness. This shows that the amount of nitrogen bonded to silicon is decreased and that of oxygen is increased, that is, this shows that the oxidation of the film proceeds. When compared by the films with the same thickness, the silicon nitride film with a smaller initial thickness has the larger chemical shift and the bonding state of silicon becomes closer to that of the silicon dioxide.

Figure 12B:
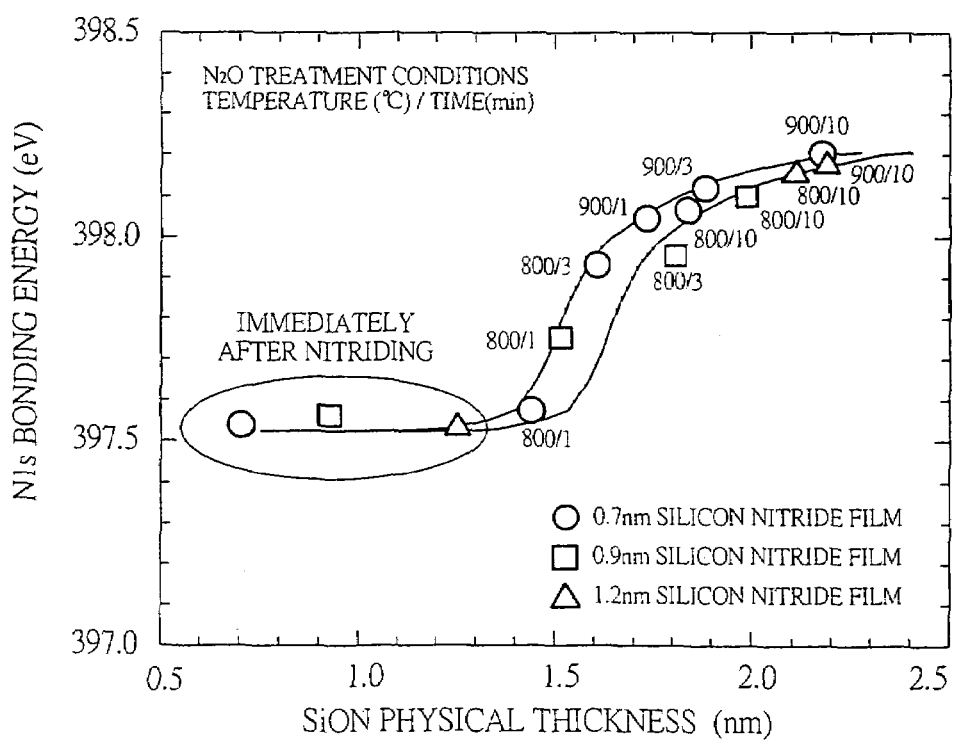
FIG. 12B is a graph showing the relationship between the physical thickness of a silicon oxynitride film formed in performing a thermal treatment of a silicon nitride film in an $N_2O$ atmosphere and the N1s bonding energy.

Also, the relationship between the N1s bonding energy resulting from the thermal treatment in the $N_2O$ atmosphere and the thickness of the silicon oxynitride film is shown in FIG. 12B. Energy values are corrected by setting the bonding energy of Si2p electron in the Si substrate to 99.2 eV. The N1s bonding energy immediately after the thermal treatment is approximately 397.5 eV, and its value coincides with the bonding energy of nitrogen in the silicon nitride film (triple bonding of nitrogen and silicon). Furthermore, when the thermal treatment is performed in the $N_2O$ atmosphere, the N1s bonding energy is increased along with the increase of the thickness. The change of bonding energy corresponds to the fact that the second-neighboring atoms viewed from nitrogen atom are changed from nitrogen to oxygen. Additionally, as the initial thickness of the silicon nitride film is smaller, the N1s bonding energy is larger with respect to the same thickness. This shows that a large number of oxygen atoms are present in the second-neighboring atoms of the nitrogen.

It can be understood from the above-mentioned results that, by performing the thermal treatment of the silicon nitride film in the $N_2O$ atmosphere, the oxidation in which nitrogen is replaced by oxygen proceeds and simultaneously the thickness of the film is increased. There are the following two reasons why the film thickness is increased. The first is the density reduction due to the oxidation of the silicon nitride film (density $(Si_3N_4)$=3.35 g/cm$^3$ and density $(SiO_2)$=2.21 g/cm$^3$). More specifically, when the nitrogen of the silicon nitride film is all replaced by oxygen to form silicon dioxide, the film thickness is increased 1.9 times. The second is the oxidation (oxynitridation) of the Si substrate. For example, when the thermal treatment of the Si substrate is performed in the $NH_3$ atmosphere at 700° C. for 1 minute, the silicon nitride film with a thickness of approximately 0.7 nm is formed. Therefore, if the film thickness after the thermal treatment in the $N_2O$ atmosphere is increased 1.9 times, that is, is approximately 1.4 nm or more, it can be said that the oxidation (oxynitridation) of the Si substrate has proceeded.

Next, for the understanding of the profile of the N/Si ratio in the silicon oxynitride film, a depth distribution of the N/Si ratio in the silicon oxynitride film is revealed by combining the etching continuously performed in the diluted HF (HF/$H_2O$=1/150) and the XPS measurement after performing the thermal treatment of the silicon nitride film in the $N_2O$ atmosphere.

Figure 13A:
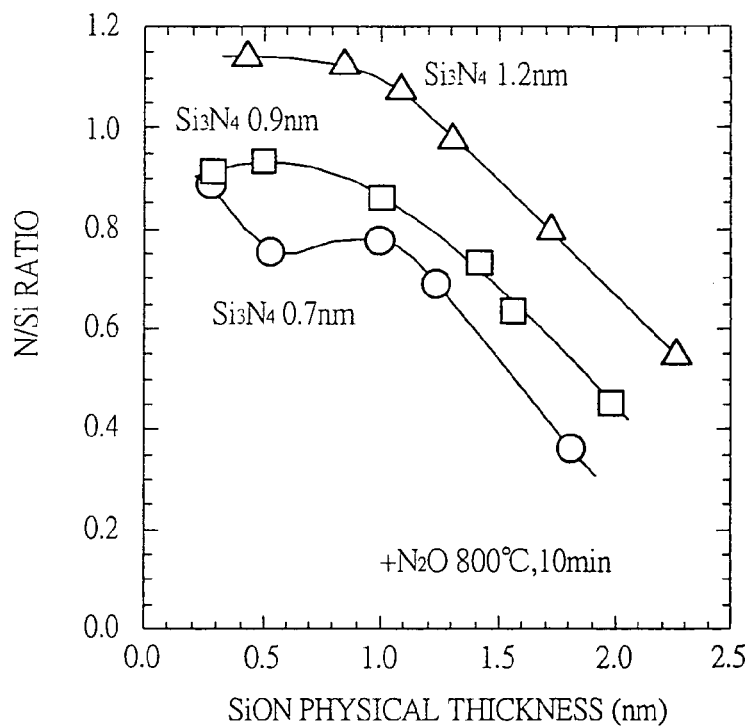
FIG. 13A is a graph showing, in the case where the physical thickness of a silicon nitride film is varied under the conditions that the thermal treatment is set at 800° C. for 10 minutes, the relationship between the nitrogen concentration (N/Si ratio) of a silicon oxynitride film and the physical thickness after the etching.

The depth distritubtion of the N/Si ratio in the silicon oxynitride film is shown in FIG. 13A. A SiON physical thickness of 0.0 nm on the horizontal axis indicates the substrate interface and a SiON physical thickness of 2.0 nm indicates the initial thickness of the silicon nitride film. The samples are the silicon oxynitride films obtained by: forming silicon nitride films with various thicknesses (thickness: 0.7, 0.9, and 1.2 nm) by the thermal treatment in the $NH_3$ atmosphere; and then performing the thermal treatment of them in the $N_2O$ atmosphere at 800° C. for 10 minutes. During the etching of these films in the diluted HF, the depth distribution of the N/Si ratio is examined by the XPS measurement. The N/Si ratio shown here is the average N/Si ratio of the whole film after the etching and is not the N/Si ratio at a certain depth position. Therefore, if the N/Si ratio is increased by the etching, the N/Si ratio at the position close to the Si substrate is large. To the contrary, if the N/Si ratio is reduced by the etching, the N/Si ratio at the position close to the surface region is large.

As shown in FIG. 13A, the average N/Si ratio in the silicon oxynitride film is increased after the etching in each of the silicon oxynitride films. That is, the N/Si ratio is small on a surface side of the silicon oxynitride film and is large on a side close to the Si substrate. Additionally, with respect to the average N/Si ratio at the position close to the Si substrate (within approximately 0.5 nm), as the silicon nitride film is thicker, the N/Si ratio thereof is larger. When the thickness of the silicon nitride film is 1.2 nm, the N/Si ratio near the Si substrate is approximately 1.2. This corresponds to the N/Si ratio immediately after the nitriding as shown in FIG. 11 and therefore indicates that the oxidation does not reach the Si substrate.

Figure 13B:
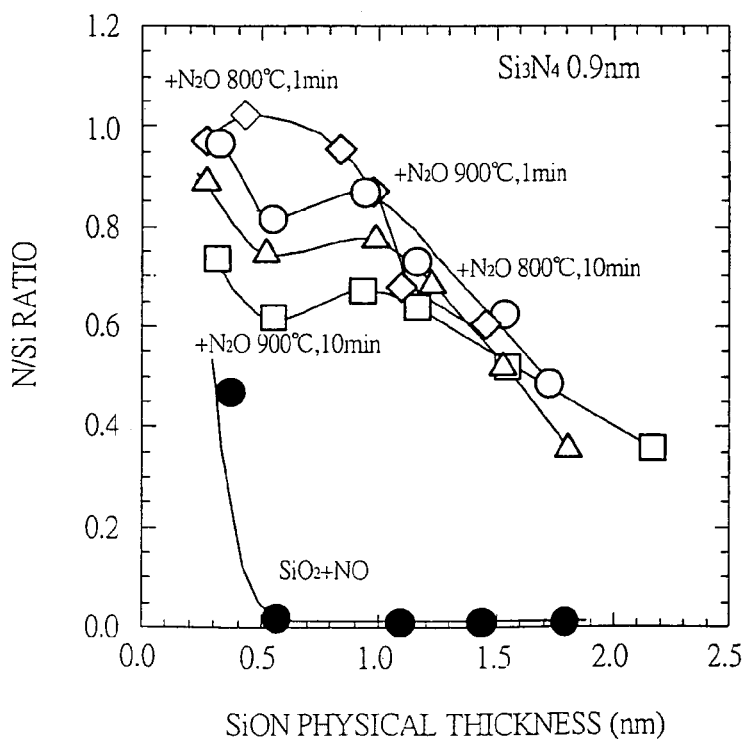
FIG. 13B is a graph showing, in the case where the physical thickness of a silicon nitride film is set to 0.7 nm, the relationship between the nitrogen concentration (N/Si ratio) of a silicon oxynitride film and the physical thickness after the etching.

A depth distribution (thickness dependence after the etching) of the N/Si ratio in the case where the thickness of the silicon nitride film is fixed to 0.7 nm and the conditions of the thermal treatment in the $N_2O$ atmosphere are changed is shown in FIG. 13B. The conditions of the thermal treatment in the $N_2O$ atmosphere are: for 1 minute and 10 minute at 800° C.; and for 1 minute and 10 minutes at 900° C. The thicknesses of the silicon oxynitride film after the thermal treatment in the $N_2O$ atmosphere is reduced in order of the thermal treatment conditions of: "900° C. and 10 minutes" (represented by in FIG. 13B and then its thickness is 2.2 nm); "800° C. and 10 minutes" (represented by $\Delta$ in FIG. 13B and then its thickness of 10.8 nm); "900° C. and 1 minute" (represented by O in FIG. 13B and then its thickness is 1.7 nm); and "800° C. and 1 minute" (represented by $\Diamond$ in FIG. 13B and then its thickness is 1.5 nm). In the thermal treatment, at 800° C. for 1 minute, which forms the thinnest film, the N/Si ratio is increased as the etching proceeds, and is almost saturated (N/Si ratio=1.0) in the region disposed approximately 0.5 nm apart from the Si substrate. Meanwhile, in the thermal treatment under the other conditions, the N/Si ratio has its minimum values at almost the same positions, and the minimum vales of the N/Si ratio are increased in order of the thermal treatment conditions of "900° C. and 10 minutes"<"800° C. and 10 minutes"<"900° C. and 1 minute".

As described with reference to FIGS. 12A and 12B, if the thickness of the silicon oxynitride film is increased to 1.4 nm or more by the thermal treatment in the $N_2O$ atmosphere, it can be said that the oxynitridation of the surface of the Si substrate has proceeded. Therefore, since the thickness of the silicon oxynitride film is approximately 1.5 nm in the thermal treatment under the conditions of "800° C. and 1 minute", the Si substrate is slightly oxynitrided. However, since the thickness of the silicon oxynitride films is grown to approximately 1.7 to 2.2 nm in the thermal treatment under the conditions of "800° C. and 10 minute", "900° C. and 1 minute", and "900° C. and 10 minutes", the Si substrate is surely oxynitrided.

It is thought that the minimum values of the N/Si ratio at the positions close to the Si substrate shown in FIGS. 13A and 13B indicate that the oxynitridation of the underlying Si substrate is started through the oxidized silicon nitride film. The result ($SiO_2$+NO) of the thermal treatment performed to the silicon oxide film at 950° C. in the NO atmosphere is shown in FIG. 13B. It can be understood that the N/Si ratio of the NO—$SiO_2$ film is rapidly increased near the interface of the Si substrate. This indicates that nitrogen is selectively introduced around the interface of the Si substrate and a state of the triple bonding ($Si_3N_4$) is formed with silicon. The NO—$SiO_2$ film, and the silicon nitride film after the thermal treatment in the $N_2O$ atmosphere in which the oxynitridation of the Si substrate surface has proceeded are similar in that the N/Si ratio is increased in the region disposed approximately 0.5 nm apart from the Si substrate interface.

It can be understood from the above-mentioned results that, in the thermal treatment in the $N_2O$ atmosphere, the oxidation process of the silicon oxynitride film includes the following two steps. A first step is an oxidation one in which nitrogen in the silicon nitride film is replaced by oxygen, whereby the oxidation proceeds from the surface of the silicon nitride film and the N/Si ratio in the silicon oxynitride film becomes smaller toward the film surface. A second step is one in which the oxidation further proceeds and the Si substrate below the silicon nitride film is reacted thereto, whereby the silicon oxynitride film to which oxygen as well as nitrogen is supplied is formed.

Therefore, as shown in FIG. 10, it can be thought that: the thermal treatment is performed in the $N_2O$ atmosphere at 900° C. for 1 minute and the 0.7 nm thick silicon nitride film 14 is formed on the semiconductor substrate 1; and thereafter the silicon oxynitride film formed by performing the thermal treatment in the $N_2O$ atmosphere at 900° C. for 1 minute is composed of a first silicon oxynitride film 15a formed by oxynitriding the silicon nitride film 14 and a second silicon oxynitride film 15b formed by oxynitriding the substrate 1 below the silicon nitride film 14.

Figure 14A:
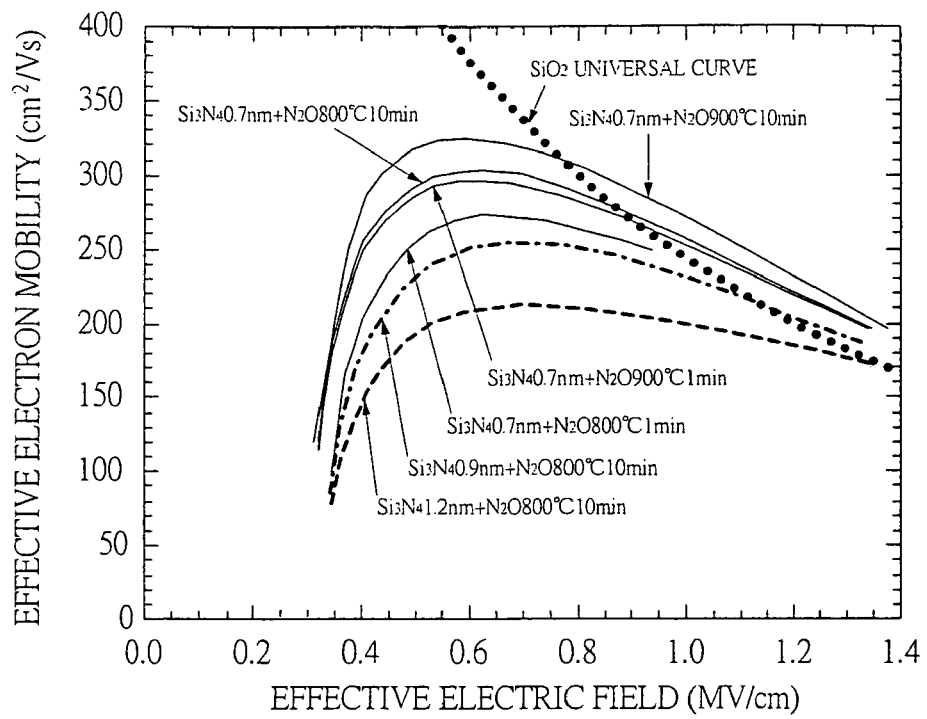
FIG. 14A is a graph showing the relationship between the effective electron mobility and the effective field effect of an n type MISFET.
Figure 14B:
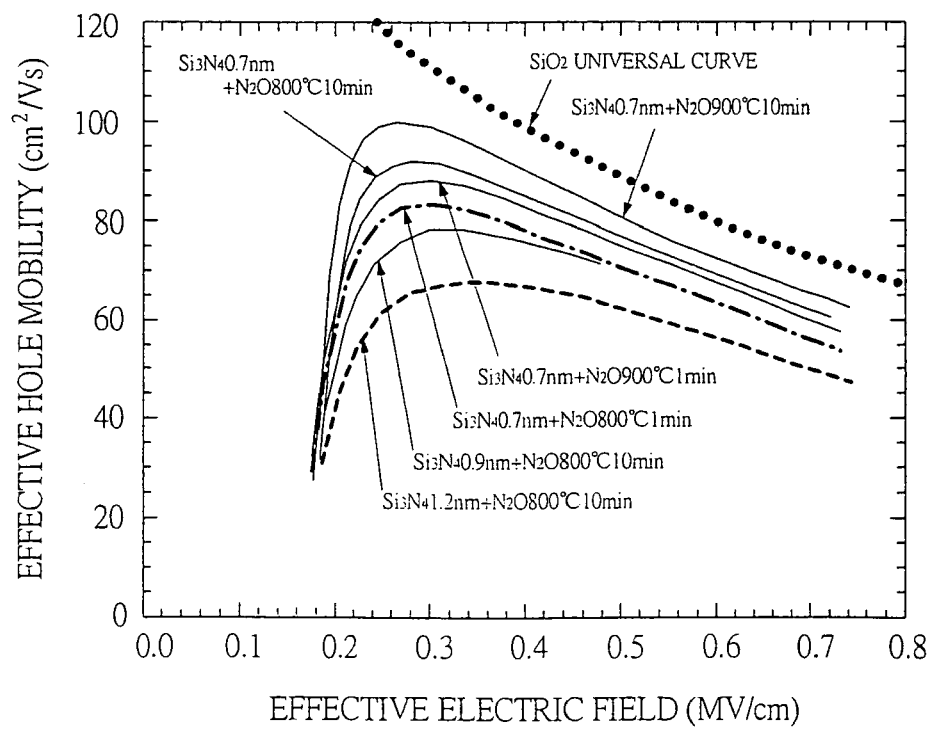
FIG. 14B is a graph showing the relationship between the effective hole mobility and the effective field effect of a p type MISFET.

The effective electric field dependence of the effective mobility in the n and p type MISFETs, in which the silicon oxynitride film with the nitrogen profile shown in FIGS. 13A and 13B is used as the gate insulator, is respectively shown in FIGS. 14A and 14B.

As shown in FIGS. 14A and 14B, it can be understood that the mobility is increased as the oxynitridation of the Si substrate proceeds by the thermal treatment in the $N_2O$ atmosphere. Also, in the silicon oxynitride film in which the oxynitridation does not reach the Si substrate, the mobility is significantly reduced. By the detailed analysis for the mobility in the silicon oxynitride film in which the oxynitridation does not reach the Si substrate, it is shown that the fixed charges in the film are $5 \times 10^{12}$ $cm^{-1}$ or more. Meanwhile, in the silicon oxynitride film in which the oxynitridation reaches the Si substrate, the fixed charges in the film are $5 \times 10^{12}$ $cm^{-2}$ or less. Also, according to measurement of the interface level of these films, it is confirmed that it is $10^{11}$ $cm^{-2}$ or less in a midgap.

Also, similarly to FIG. 6, according to the examination of the relationship between the driving current and the leakage current of the n type MISFET, it can be understood that the leakage current of the silicon oxynitride film formed by performing the thermal treatment to the 0.7 nm thick silicon nitride in the $N_2O$ atmosphere can be reduced to approximately 70% of that of the laminated film of a silicon oxynitride film and a metal oxide film, which is shown in FIG. 6. This indicates that, since the relative dielectric constant is increased by increasing the nitrogen concentration in the film, each equivalent $SiO_2$ thickness of the first and second silicon oxynitride films 15a and 15b can be reduced when compared under the same thickness.

Figure 15:
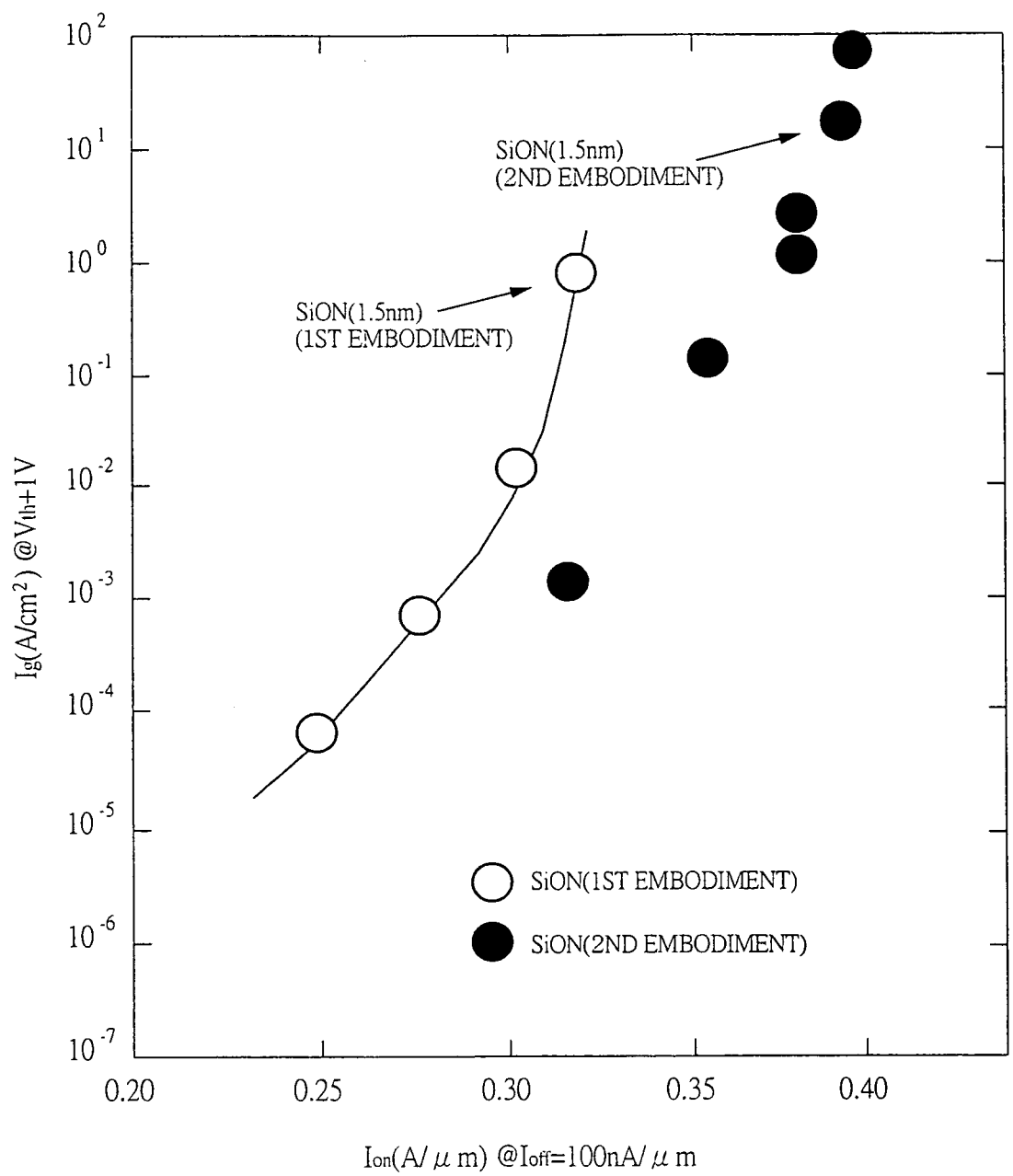
FIG. 15 is a graph showing the relationship between the driving current (Ion) and the leakage current (Ig) of a p type MISFET.

The relationship between the driving current (Ion) and the leakage current (Ig) in a p type MISFET having a gate electrode made of boron-doped polycrystalline silicon is shown in FIG. 15. The definition of the driving current and the leakage current is the same as that described in FIG. 6. As is apparent from FIG. 15, it can be understood that the driving current in the silicon oxynitride film formed by performing the thermal treatment to the 0.7 nm thick silicon nitride film in the $N_2O$ atmosphere can be increased in comparison to the silicon oxynitride film shown in the first embodiment. This is because, since the nitrogen concentration in the silicon oxynitride film of this embodiment is larger than that in the silicon oxynitride film shown in the first embodiment, the penetration of boron can be prevented even if the film thickness is reduced.

Note that the case where the silicon nitride film is formed by the thermal treatment in the $NH_3$ atmosphere has been described in the foregoing embodiment. However, it is also possible to use the method of forming the silicon nitride film by the nitrization in $N_2$ plasma or $NH_3$ plasma. Additionally, with respect to the thermal treatment in the $N_2O$ atmosphere, a mixed gas of $N_2O$ and $N_2$ or of $N_2O$ and $O_2$ is also available instead of $N_2O$. Furthermore, the same effects can be also achieved by using a mixed gas of NO and $O_2$. In this case, a ratio of $NO/O_2$ flow is preferably set to 1/20. Further, since the silicon oxynitride film formed in the above-described manner has almost the same surface compositions as those of the silicon oxide film, it is possible to form the silicon nitride film only on the outermost surface thereof by nitriding the outermost surface in the $N_2$ plasma or the $NH_3$ plasma. In this case, the reduction of the leakage current can be achieved by further reducing the equivalent $SiO_2$ thickness. Also, it is possible to use refractory metal nitride such as TaN, TiN, WN, MoN, ZrN, and HfN as the material of the gate electrode in addition to the polycrystalline silicon film.

As described above, according to the second embodiment, after forming the silicon nitride film 14 with a thickness of 0.9 nm or less on the semiconductor substrate 1, the silicon nitride film 14 is oxynitrided by the thermal treatment in the NO or $N_2O$ atmosphere and is changed into the silicon oxynitride film (first and second silicon oxynitride films 15a and 15b), and this silicon oxynitride film is used as the gate insulator, whereby the desired operational characteristics of the MISFET can be achieved.

Third Embodiment

Figure 16:
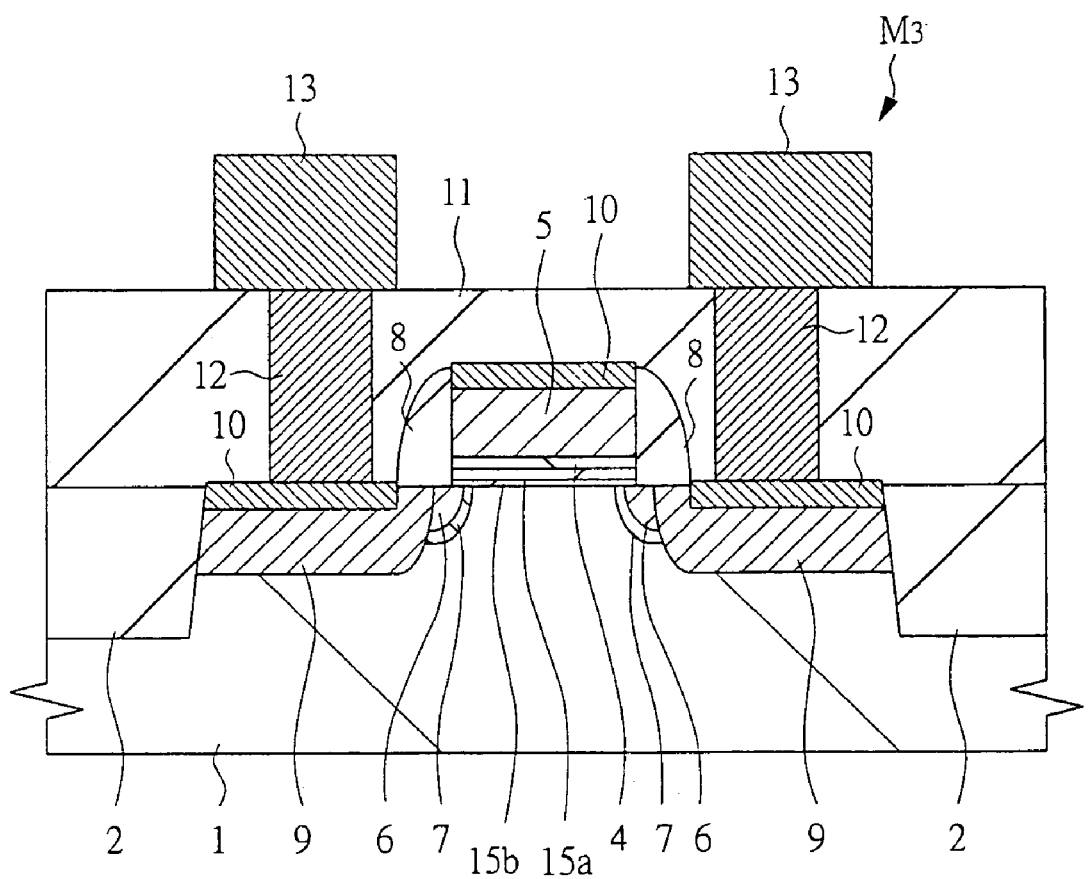
FIG. 16 is a sectional view of the principal portion of a semiconductor substrate showing the n type MISFET according to a third embodiment of the present invention.

FIG. 16 is a sectional view of the principal portion of the semiconductor substrate showing an n type MISFET according to a third embodiment. As shown in FIG. 16, an n type MISFET $M_3$ according to the third embodiment has a gate insulator formed of the laminated film obtained by depositing, on the alumina film 4, the first and second silicon oxynitride films 15a and 15b described in the second embodiment. For example, the n type MISFET $M_3$ can be formed in the following manner.

For example, device isolation insulating regions 2 for defining active regions are formed in a semiconductor substrate 1 made of single crystal silicon with plane direction (100), a p conductivity type, and a diameter of 20 cm. Subsequently, an implantation of p conductivity type ions for adjusting a substrate concentration and a thermal treatment for enlargement, as well as an ion implantation for adjusting the threshold voltage and a thermal treatment for activation are respectively performed by the conventional and well-known manner.

Next, after the removal of the natural oxide film on the surface of the semiconductor substrate 1 by the cleaning using the diluted hydrofluoric acid, the thermal treatment in the $NH_3$ atmosphere at 700° C. for 1 minute is performed to form a 0.7 nm thick silicon nitride film on the semiconductor substrate 1. Additionally, the thermal treatment in the $N_2O$ atmosphere at 900° C. for 1 minute is performed to form the silicon oxynitride film with a thickness of 1.7 nm. This silicon oxynitride film is composed of the first silicon oxynitride film 15a formed by oxynitriding the silicon nitride film and the second silicon oxynitride film 15b formed by oxynitriding the substrate 1 below the silicon nitride film. At this time, the thickness of the silicon nitride film is set to 0.7 nm or less, and the silicon oxynitride film is formed so that its thickness after performing the thermal treatment in the NO or $N_2O$ atmosphere can be 1.9 times or more of the silicon nitride film, whereby the thickness of the silicon oxynitride film is controlled to 1.5 nm or more.

Next, the alumina film 4 is formed on the first silicon oxynitride film 15a by the atomic layer deposition method. For example, the alumina can be formed at 300° C. by alternately supplying trimethyl aluminum and $H_2O$ to be materials. When one supply of each gas is defined as one cycle, the alumina film 4 with a thickness of 1.0 to 3.0 nm is deposited by performing 15 to 40 cycles. In the foregoing, the case where the alumina film 4 formed by the atomic layer deposition method is used as an example of a metal oxide film has been described. However, it is also possible to deposit a hafnia film or a zirconia film by selecting $HfCl_4$ or $ZrCl_4$ as a material gas. Since these films each have high relative dielectric constant, the hafnia film or the zirconia film with a thickness of 1.0 to 7.0 nm can be deposited by repeatedly performing 20 to 160 cycles.

Also, as the deposition method of the metal oxide film, organic metal chemical vapor deposition or a sputtering method is also available. In the organic metal chemical vapor deposition, a hafnia film can be deposited by using Hf-t-butoxide as a material, and a zirconia film can be deposited by using Zr-t-butoxide as a material. By the sputtering method employing an Ar gas in which Al, Hf, and Zr, etc. are used as target metals, it is also possible to deposit the metals of Al, Hf, and Zr on a silicon oxynitride film, and oxidize them in a post-step to form the alumina film, the hafnia film, and the zirconia film. Additionally, it is also possible to form metal oxide by a reactive sputtering method performed while oxygen is supplied thereto. Also, when hafnia and zirconia are selected as the metal oxide, mutual diffusion proceeds (a silicate layer is formed) between the silicon oxynitride film and the metal oxide film by the thermal treatment performed during the deposition or after the formation of these films and thereby the boundary between the silicon oxynitride film and the metal oxide film becomes unclear in comparison to the case of using alumina. In the case of using these films, it is necessary to control the thickness of the silicon oxynitride film so that the area density of Hf, Zr, and Al can be $5\times10^{13}$ atom/cm$^2$ or less within a region of 1.5 nm or less from a Si substrate.

Next, the thermal treatment at 700° C. or higher in the $N_2$ or reduced pressure oxygen atmosphere is performed to densify the alumina film 4 or to compensate the oxygen vacancy in the alumina film 4. Subsequently, an in-situ phosphorus doped polycrystalline silicon film with a thickness of approximately 100 nm to be the gate insulator 5 is formed on the alumina film 4. This in-situ phosphorus doped polycrystalline silicon film can be deposited at 630° C. with using, for example, monosilane and hosfine as material gases. The n type MISFET $M_3$ is almost completed using the same manufacturing method as that shown in the first embodiment.

Similarly to FIG. 6, according to the examination for the relationship between the driving current and the leakage current in the n type MISFET formed in the above-described manner, the silicon oxynitride film formed by the thermal treatment of the silicon nitride film with a thickness of 0.7 nm in the $N_2O$ atmosphere can reduce the leakage current to approximately 50%, in comparison to the laminated film of the silicon oxynitride film and the metal oxide film shown in FIG. 6. This is because, since the relative dielectric constant is increased by increasing the nitrogen concentration in the silicon oxynitride film, the equivalent $SiO_2$ thickness of the silicon oxynitride film can be reduced when compared under the same thickness. As a result, this indicates that the equivalent $SiO_2$ thickness of the laminated film of the silicon oxynitride film and the metal oxide film can also be reduced.

Figure 17:
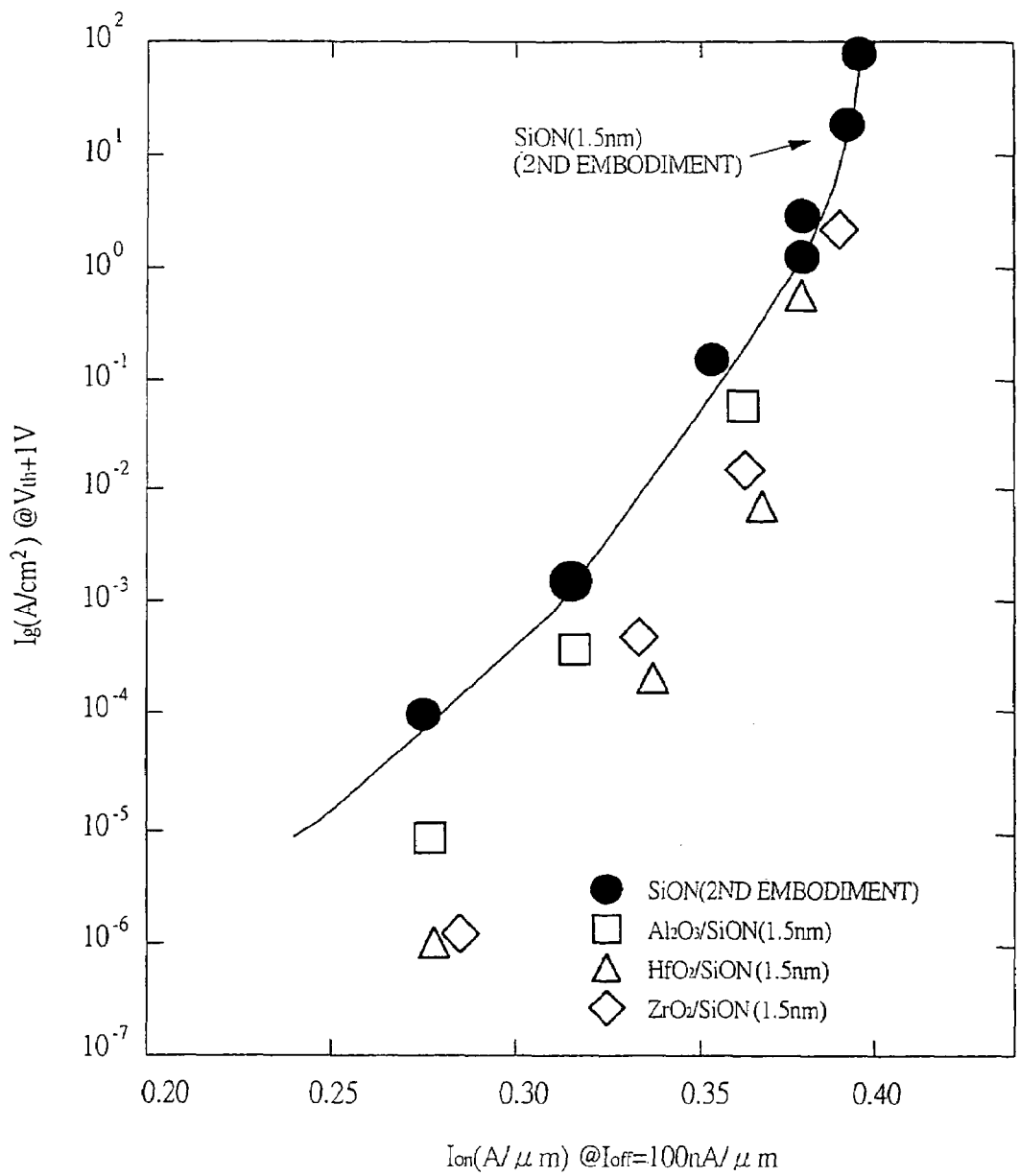
FIG. 17 is a graph showing the relationship between the driving current (Ion) and the leakage current (Ig) of a p type MISFET.

The relationship between the driving current (Ion) and the leakage current (Ig) of the p type MISFET is shown in FIG. 17. A 1.5 nm thick film formed by performing the thermal treatment of the 0.7 nm thick silicon nitride film in the $N_2O$ atmosphere is used as a silicon oxynitride film. The results of the case where the alumina film with a thickness of 1.0 to 2.0 nm, the hafnia film with a thickness of 1.0 to 5.0 nm, and the zirconia film with a thickness of 1.0 to 5.0 nm are used as metal oxide films are shown in FIG. 17. The definitions of the driving current and the leakage current are the same as that described in FIG. 6.

As shown in FIG. 17, it is possible to further reduce the leakage current in comparison to the silicon oxynitride film (shown in FIG. 15) described in the second embodiment. This is because, by laminating the metal oxide film on the silicon oxynitride film, the thickness of the film can be increased while the equivalent $SiO_2$ thickness is reduced.

The case where alumina, hafnia, and zirconia are used as examples has been described in the above-mentioned embodiment. However, $ZrSiO_4$, $HfSiO_4$, $Y_2O_3$, $La_2O_3$, $CeO_2$ or a laminated film of these metal oxides can also be used to achieve the same effects. Also, the silicon nitride film is formed by the thermal treatment in the $NH_3$ atmosphere in the foregoing description. However, it is also possible to use the method of forming the silicon nitride film by the nitrization in the $N_2$ plasma or $NH_3$ plasma. Additionally, with respect to the thermal treatment in the $N_2O$ atmosphere, a mixed gas of $N_2O$ and $N_2$ or of $N_2O$ and $O_2$ is also available instead of $N_2O$. Furthermore, the same effects can be achieved by using a mixed gas of NO and $O_2$. In this case, a ratio of $NO/O_2$ flow is preferably set to 1/20. Additionally, since the silicon oxynitride film formed in the above-described manner has almost the same surface compositions as those of the silicon oxide film, it is possible to form the silicon nitride film on the outermost surface thereof by nitriding the outermost surface in the $N_2$ plasma or $NH_3$ plasma. In this case, the reduction of the leakage current can be achieved by further reducing the equivalent $SiO_2$ thickness.

Thus, according to the third embodiment, the laminated film formed by depositing the alumina film 4 on the silicon oxynitride film (first and second silicon oxynitride films 15a and 15b) obtained by the oxynitridation of the silicon nitride film by the thermal treatment in the NO or $N_2O$ atmosphere constitutes the gate insulator of the MISFET. By so doing, it becomes possible to further reduce the leakage current, in comparison to the cases of using the laminated film composed of the silicon oxynitride film 3 and the alumina film 4 as shown in the first embodiment and of using the silicon oxynitride film (first and second silicon oxynitride films 15a and 15b) as shown in the second embodiment as the gate insulator.

Fourth Embodiment

Figure 18:
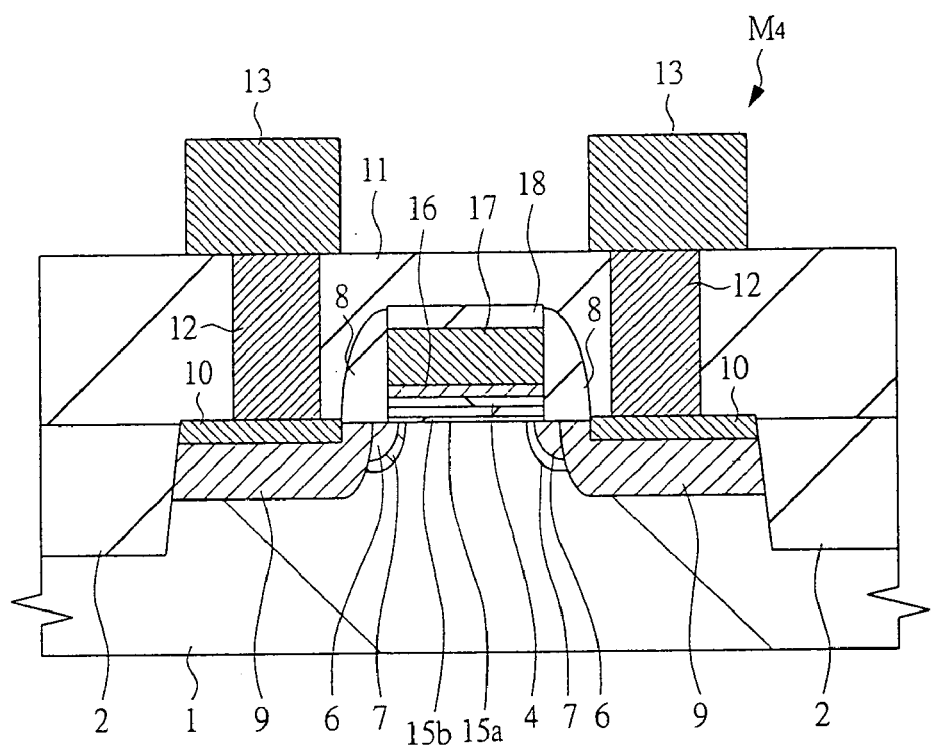
FIG. 18 is a sectional view of the principal portion of a semiconductor substrate showing the n type MISFET according to a fourth embodiment of the present invention.
Figure 19:
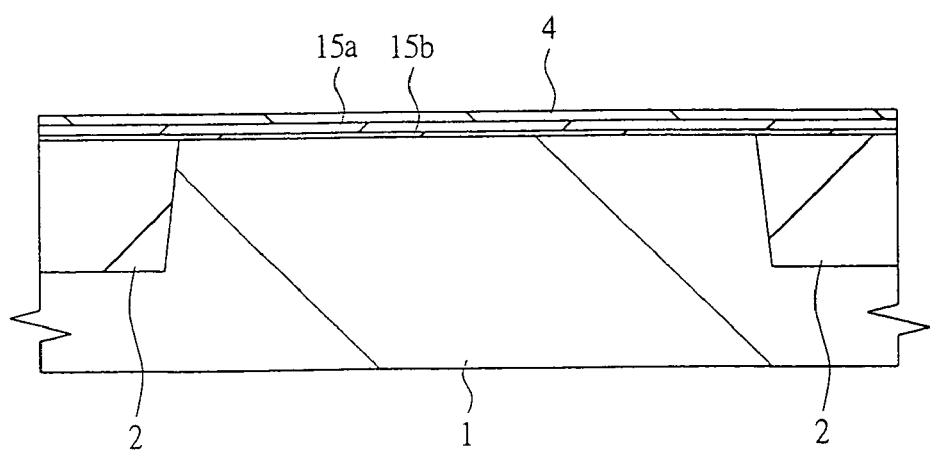
FIG. 19 is a sectional view of the principal portion of a semiconductor, which shows a manufacturing method for the n type MISFET according to a fourth embodiment of the present invention.
Figure 20:
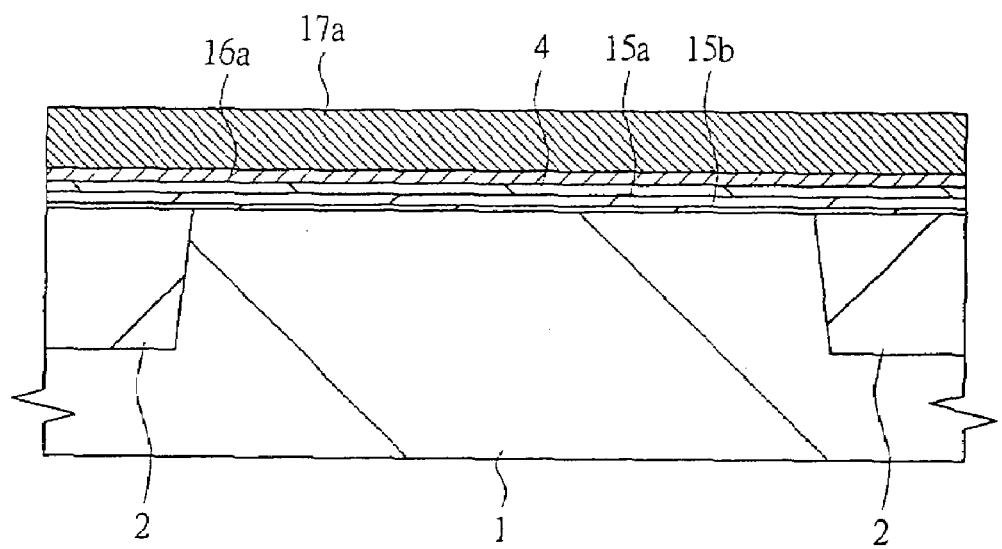
FIG. 20 is a sectional view of principal portion of a semiconductor substrate, which shows a manufacturing method of the n type MISFET according to a fourth embodiment of the present invention.
Figure 21:
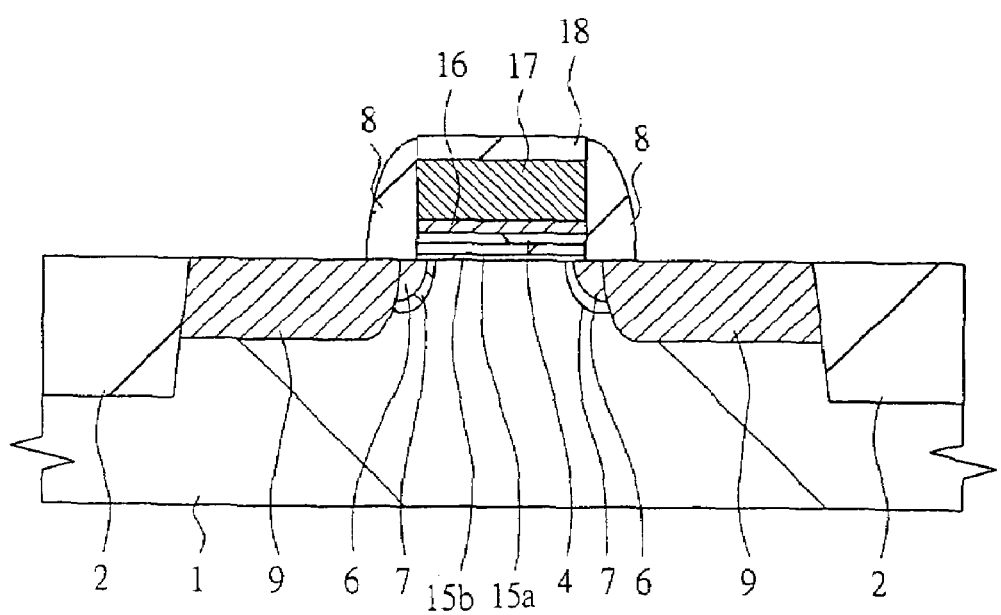
FIG. 21 is a sectional view of the principal portion of a semiconductor substrate, which shows of the n type MISFET according to a fourth embodiment of the present invention.

FIG. 18 is a sectional view of the principal portion of the semiconductor substrate showing the n type MISFET according to a fourth embodiment, and FIGS. 19 to 21 are schematic views showing a manufacturing process of the n type MISFET. As shown in FIG. 18, an n type MISFET $M_4$ according to a fourth embodiment is characterized in that metal gates 16 and 17 are formed on the gate insulator composed of the first and second silicon oxynitride films 15a and 15b and the alumina film 4, the gate insulator being described in the third embodiment.

First, as shown in FIG. 19, after forming, on the semiconductor substrate 1, the gate insulator formed of the laminated film of the first and second silicon oxynitride films 15a and 15b and the alumina film 4 described in the third embodiment, a TaN film 16a which is the refractory metal nitride is formed by the reactive sputtering method, as shown in FIG. 20. TiN, WN, MoN, ZrN, and HfN are also available instead of TaN. Subsequently, a tungsten (or molybdenum) film 17a that is a refractory metal is formed by the sputtering or the CVD (Chemical Vapor Deposition) method.

Next, as shown in FIG. 21, after depositing a silicon oxide film on the tungsten film 17a, a cap insulator 18 formed of the silicon oxide film, a metal gate electrode 17 formed of the tungsten film 17a, and a metal gate electrode 16 formed of the TaN film 16a are formed by the etching with using a photoresist film as a mask. Subsequently, arsenic ions are vertically implanted under the conditions of an acceleration energy of 3 keV and a dose amount of $1 \times 10^{15}/cm^2$ to form shallow diffusion layers 6. Then, boron ions are vertically implanted under the conditions of an acceleration energy of 10 keV and a dose amount of $4 \times 10^{13}/cm^2$ so as to surround the shallow diffusion layers 6, whereby p conductive type diffusion layers 7 for preventing punch-through are formed.

Next, after depositing an approximately 50 nm thick silicon oxide film on the whole surface of the semiconductor substrate 1 by the plasma-assisted deposition method at a low temperature of 400° C., the deposited silicon oxide film is selectively removed by the anisotropic dry etching to form gate sidewall insulators 8 only on the sidewalls of the metal gate electrodes 16 and 17. Subsequently, arsenic ions are vertically implanted under the conditions of an acceleration energy of 30 keV and a dose amount of $2 \times 10^{15}/cm^2$ with using the gate sidewall insulators 8 as ion-implantation blocking masks and, thereby, an n high-density diffusion layer 9 is formed.

Then, after an activation thermal treatment of the implanted ions has been performed using nitrogen anneal at 1000° C. for 5 seconds, a cobalt film is deposited relatively thinly on the whole surface of the semiconductor substrate 1 by the sputtering method, and then is silicided by the short-time annealing at 500° C. The unreacted cobalt film is removed by a mixed solution of hydrochloric acid and hydrogen peroxide solution, and a cobalt silicide film 10 is selectively left on each of the exposed portions of the semiconductor substrate 1. Thereafter, the short-time thermal treatment is performed to reduce the resistance of the cobalt silicide film 10.

Next, after forming a relatively thick silicon oxide film on the whole surface of the semiconductor substrate 1, the surface of the silicon oxide film is planarized by the chemical mechanical polishing to form a surface protection insulator 11. Subsequently, after forming holes in desired regions of the surface protection insulator 11, a TiN film used as a diffusion barrier of a wiring metal and a tungsten film used as a wiring metal are deposited, and then the TiN film and the tungsten film are polished for planarization and are selectively left only inside the holes, whereby plugs 12 are formed. Thereafter, a metal film mainly made of aluminum is deposited and patterned in accordance with a desired circuit configuration, and thereby wirings including source and drain electrodes 13 are formed. In this manner, the n type MISFET $M_4$ shown in FIG. 18 is almost completed.

Thus, according to the fourth embodiment, the laminated film formed by depositing the alumina film 4 on the silicon oxynitride film (first and second silicon oxynitride films 15a and 15b) obtained by the oxynitriding the silicon nitride film by the thermal treatment in the NO or $N_2O$ atmosphere constitutes the gate insulator, and the refractory metal nitride film and the refractory metal film constitute the metal gate electrodes 16 and 17. Therefore, it becomes possible to further reduce the leakage current in comparison to the case of using, as the gate insulator, the laminated film composed of the silicon oxynitride film 3 and the alumina film 4 according to the first embodiment. Furthermore, since impurity penetration caused at the time of using the gate electrode made of polycrystalline silicon to which impurities are added is prevented, the reduction of the driving current of the MISFET can be prevented.

In the foregoing, the invention made by the inventors has been concretely described based on the embodiments. However, needless to say, the present invention is not limited to the above-mentioned embodiments and can be variously modified and altered without departing from the gist thereof.

The effects obtained by the typical ones of the inventions disclosed in this application will be briefly described as follows.

The gate insulator of the MISFET is constituted by the laminated film, composed of a silicon oxynitride film with a thickness of 1.5 nm or more and a relative dielectric constant of 4.1 or higher and a metal oxide film. Therefore, it is possible to obtain the MISFET with large driving current and small leakage current even if the electric charges exist in the interface between the silicon oxynitride film and the metal oxide film. For this reason, it becomes possible to achieve the reduction of power consumption used and the increase of the current flowing in the miniaturized MISFET.

What is claimed is:

1. A manufacturing method of a semiconductor device, in which a field effect transistor, including a gate insulator formed on a substrate, the gate insulator being formed of a silicon oxynitride film with an equivalent $SiO_2$ thickness of 2.5 nm or less and a gate electrode formed on said gate insulator is formed, the method comprising the steps of:

forming, on said substrate, a silicon nitride film with a physical thickness of 0.9 nm; and forming said silicon oxynitride film by performing a thermal treatment of said silicon nitride film in a NO or $N_2O$ atmosphere, wherein the physical thickness of said silicon oxynitride film is increased 1.9 times or more of said silicon nitride film, wherein the thermal treatment in said NO or $N_2O$ atmosphere comprises the steps of:

forming a first silicon oxynitride film by replacing nitrogen in said silicon nitride film by oxygen; and forming a second silicon oxynitride film by oxynitriding said substrate, wherein said silicon oxynitride film composed of said first and second silicon oxynitride film is formed.

2. A manufacturing method of a semiconductor device, comprising the steps of:

forming a field effect transistor including a gate insulator formed on a substrate, the gate insulator having an equivalent $SiO_2$ thickness of 2.5 nm or less, and a gate electrode formed on said gate insulator, wherein said gate insulator is a laminated film composed of a silicon oxynitride film coming into contact with said substrate and a metal oxide film with a relative dielectric constant higher than that of said silicon oxynitride film, the physical thickness of said silicon oxynitride film is 1.5 nm or more, and the relative dielectric constant of said silicon oxynitride film is in a range of 4.1 to 5.0, wherein said silicon oxynitride film is formed by performing a thermal treatment of a silicon nitride film formed on said substrate in a NO or $N_2O$ atmosphere.

3. The manufacturing method of a semiconductor device according to claim 2, wherein said gate electrode is formed of a polycrystalline silicon film or a refractory metal nitride film.

4. A manufacturing method of a semiconductor device, comprising the steps of:

forming a field effect transistor including a gate insulator formed on a substrate, the gate insulator having an equivalent $SiO_2$ thickness of 2.5 nm or less, and a gate electrode formed on said gate insulator, wherein said gate insulator is a laminated film composed of a silicon oxynitride film coming into contact with said substrate and a metal oxide film with a relative dielectric constant higher than that of said silicon oxynitride film, the physical thickness of said silicon oxynitride film is 1.5 nm or more, and the relative dielectric constant of said silicon oxynitride film is 4.1 or higher, wherein said silicon oxynitride film is formed by performing a thermal treatment of said substrate, a silicon oxide film formed on said substrate, or a silicon nitride film formed on said substrate in a NO or $N_2O$ atmosphere, wherein said thermal treatment in said NO or $N_2O$ atmosphere comprises the steps of:

forming a first silicon oxynitride film by replacing nitrogen in said silicon nitride film by oxygen; and forming a second silicon oxynitride film by oxynitriding said substrate, wherein said silicon oxynitride film composed of said first and second silicon oxynitride films is formed.

5. The manufacturing method of a semiconductor device according to claim 4, wherein said gate electrode is formed of a polycrystalline silicon film or a refractory metal nitride film.

6. A manufacturing method of a semiconductor device, including a field effect transistor having a gate insulator formed on a substrate and a gate electrode formed on said gate insulator, the gate insulator being formed of a silicon oxynitride film with an equivalent $SiO_2$ thickness of 2.5 nm or less, the method comprising the steps of:

forming, on said substrate, a silicon nitride film with a physical thickness of 0.9 nm or less; and forming said silicon oxynitride film by performing a thermal treatment of said silicon nitride film in a NO or $N_2O$ atmosphere, wherein the physical thickness of said silicon oxynitride film is at least 1.9 times that of said silicon nitride film.

7. The manufacturing method of a semiconductor device according to claim 6, further comprising the step of:

nitriding the outermost surface of said silicon oxynitride film in a $N_2$ plasma or $NH_3$ plasma after the step of forming said silicon oxynitride film.

8. The manufacturing method of a semiconductor device according to claim 6, wherein fixed charges in said silicon oxynitride film is $5 \times 10^{12}$ cm$^{-2}$ or less.

9. The manufacturing method of a semiconductor device according to claim 6, wherein said silicon nitride film is formed by performing a thermal treatment of said substrate in the $NH_3$ atmosphere or in the $N_2$ plasma.

10. The manufacturing method of a semiconductor device according to claim 6, wherein said gate electrode is formed of a polycrystalline silicon film or a refractory metal nitride film.

11. The manufacturing method of a semiconductor device according to claim 6, wherein nitrogen in the NO or $N_2O$ atmosphere is introduced into the interface between said substrate and said silicon oxynitride film.

* * * * *